(12) United States Patent
Kasugai et al.

(10) Patent No.: US 11,425,325 B2
(45) Date of Patent: Aug. 23, 2022

(54) DRIVING APPARATUS, PHOTOELECTRIC CONVERSION APPARATUS, AND IMAGING SYSTEM

(71) Applicant: CANON KABUSHIKI KAISHA, Tokyo (JP)

(72) Inventors: Taichi Kasugai, Yokohama (JP); Atsushi Shimada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 153 days.

(21) Appl. No.: 16/987,544

(22) Filed: Aug. 7, 2020

(65) Prior Publication Data

US 2021/0051286 A1 Feb. 18, 2021

(30) Foreign Application Priority Data

Aug. 14, 2019 (JP) .............................. JP2019-148886

(51) Int. Cl.
*H04N 5/378* (2011.01)
*H01L 27/148* (2006.01)
*H01L 27/146* (2006.01)
*H04N 5/3745* (2011.01)

(52) U.S. Cl.
CPC ....... *H04N 5/378* (2013.01); *H01L 27/14612* (2013.01); *H01L 27/14831* (2013.01); *H04N 5/37452* (2013.01)

(58) Field of Classification Search
CPC .... H04N 5/378; H04N 5/37452; H04N 5/376; H01L 27/14612; H01L 27/14831
See application file for complete search history.

(56) References Cited

U.S. PATENT DOCUMENTS

| | | | |
|---|---|---|---|
| 10,277,839 B2 | 4/2019 | Takenaka et al. | |
| 10,567,747 B2 | 2/2020 | Hayashi et al. | |
| 2011/0228122 A1* | 9/2011 | Takenaka | H04N 5/3452 348/222.1 |
| 2011/0285887 A1* | 11/2011 | Takenaka | H04N 5/374 348/300 |
| 2014/0092285 A1* | 4/2014 | Moriyama | H04N 5/376 348/297 |
| 2017/0155863 A1* | 6/2017 | Shikina | H04N 5/369 |
| 2019/0215469 A1* | 7/2019 | Takenaka | H04N 5/3452 |

FOREIGN PATENT DOCUMENTS

JP 2017-147564 A 8/2017

* cited by examiner

*Primary Examiner* — Shahbaz Nazrul
(74) *Attorney, Agent, or Firm* — Venable LLP

(57) ABSTRACT

A driving apparatus that outputs a drive signal for driving, per row, a plurality of pixels arranged to form a plurality of rows, the driving apparatus comprising a plurality of row driving units arranged to correspond to the respective rows, wherein each of the row driving units includes: a memory unit that holds a signal for controlling the pixels in a corresponding row to be set to a charge accumulation state or a reset state; and a selection unit that selects whether to cause a state of the signal held in the memory unit to transition when a signal for readout from the pixels is input.

22 Claims, 13 Drawing Sheets

FIG. 4

INPUT VALUES TO D-FF 3235

|  |  | lat_rdd(x) | |
|---|---|---|---|
|  |  | 0 | 1 |
| lat_shd(x) | 0 | lat_fix(x) | fix_en or lat_fix(x) |
|  | 1 | 0 | fix_en |

FIG. 5

OUTPUT VALUES OF PTX(x)

|  |  | lat_rdd(x) | |
|---|---|---|---|
|  |  | 0 | 1 |
| lat_shd(x) | 0 | lat_fix(x) | ptx_rd |
|  | 1 | ptx_sh | ptx_rd or ptx_sh |

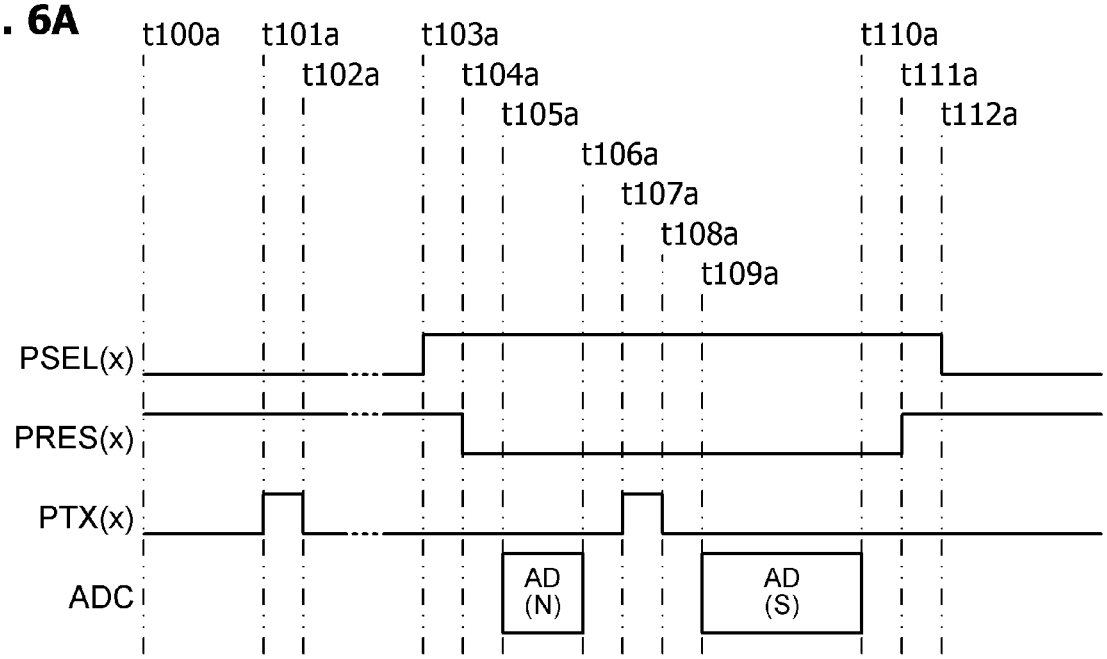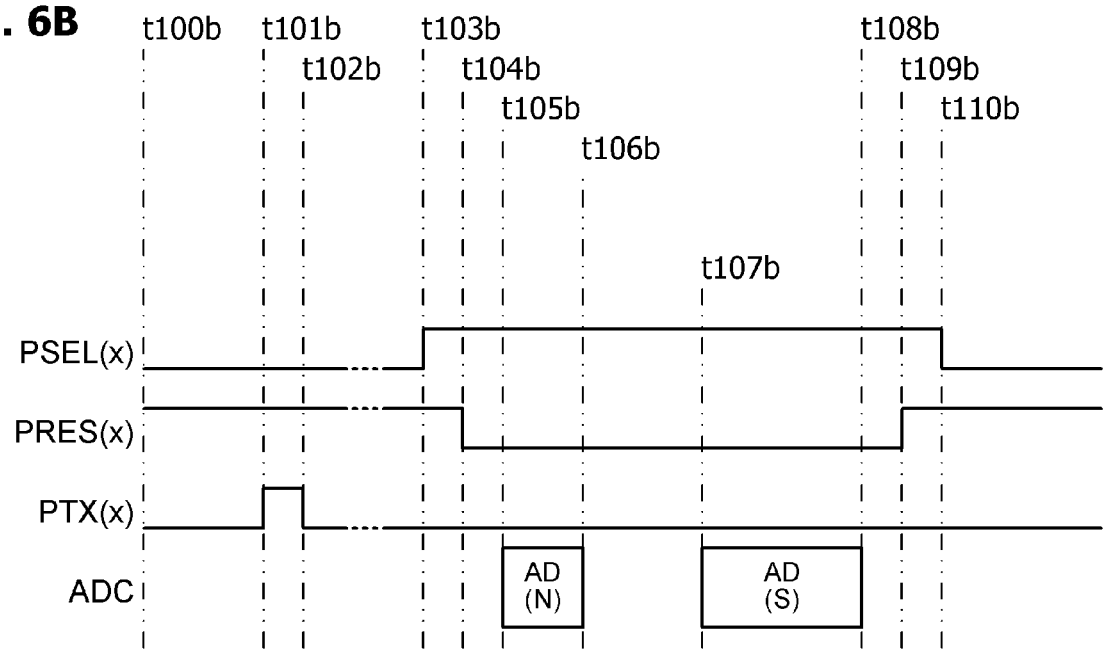

FIG. 11

INPUT VALUES TO D-FF 3235

|　|　| lat_rdd(x) | |
|---|---|---|---|
|　|　| 0 | 1 |
| lat_shd(x) | 0 | lat_fix(x) | ptx_rd or lat_fix(x) |
| | 1 | 0 | ptx_rd |

DRIVING APPARATUS, PHOTOELECTRIC CONVERSION APPARATUS, AND IMAGING SYSTEM

BACKGROUND OF THE INVENTION

Field of the Invention

The present invention relates to a driving apparatus, a photoelectric conversion apparatus, and an imaging system.

Description of the Related Art

A photoelectric conversion apparatus such as a CMOS sensor includes a plurality of pixels arranged to form a plurality of rows. A typical photoelectric conversion apparatus includes a driving apparatus that drives a plurality of pixels so that signals are read out from the pixels per row. Japanese Patent Application Laid-open No. 2017-147564 discloses a driving apparatus that sets individual photoelectric conversion element to a charge accumulation state by inputting a shutter signal and sets the individual photoelectric conversion element to a charge non-accumulation state by inputting a read signal, which is a signal for instructing to read out a signal from a charge detection unit.

The present inventors have found that, by dynamically generating signal correction values that correspond to a plurality of varying drive conditions, the performance of the photoelectric conversion apparatus can be improved. If the driving apparatus disclosed in Japanese Patent Application Laid-open No. 2017-147564 reads out a signal for generating a correction value while the photoelectric conversion element is in a charge accumulation state, the photoelectric conversion element transitions to a charge non-accumulation state (reset state), and image capturing is interrupted. In addition, if the driving apparatus reads out a signal for generating a correction value while the photoelectric conversion element is in a charge non-accumulation state, the reset state of the charge detection unit needs to be temporarily cancelled. Namely, the present inventors have found that it is preferable that the driving apparatus disclosed in Japanese Patent Application Laid-open No. 2017-147564 have a higher degree of flexibility. For example, there is a demand for providing a technique for enabling the photoelectric conversion element to maintain the charge accumulation state even when a signal is read out for generating a correction value during a charge accumulation period.

SUMMARY OF THE INVENTION

An object of the present invention is to provide a driving apparatus having a higher degree of flexibility The first aspect of the disclosure is a driving apparatus that outputs a drive signal for driving, per row, a plurality of pixels arranged to form a plurality of rows, the driving apparatus comprising a plurality of row driving units arranged to correspond to the respective rows, wherein each of the row driving units includes: a memory unit that holds a signal for controlling the pixels in a corresponding row to be set to a charge accumulation state or a reset state; and a selection unit that selects whether to cause a state of the signal held in the memory unit to transition when a signal for readout from the pixels is input.

The second aspect of the disclosure is a driving apparatus that outputs a drive signal for driving, per row, a plurality of pixels arranged to form a plurality of rows, the driving apparatus comprising a plurality of row driving units arranged to correspond to the respective rows, wherein each of the row driving units includes: a first memory unit that stores a first signal for instructing the pixels in a corresponding row to read out signals; a second memory unit that stores a second signal for instructing the pixels in the corresponding row to perform a shutter operation; and a third memory unit that stores a third signal for maintaining the pixels in the corresponding row in a charge accumulation state or a reset state, based on a signal obtained by a logical operation between the first signal output from the first memory unit and a fourth signal, and the second signal output from the second memory unit.

The third aspect of the disclosure is a photoelectric conversion apparatus comprising at least one pixel including: a charge accumulation unit that accumulates charges; an output unit that includes an input node which receives the charges and that performs an output based on a potential of the input node; a charge transfer unit that transfers the charges from the charge accumulation unit to the input node; and a reset unit that resets the charge accumulation unit or the input node, wherein a first operation starts when the charge accumulation unit is in an accumulation state, wherein a second operation is started after the first operation has been performed and while the accumulation state of the charge accumulation unit in the first operation is continued, wherein in the first operation, the reset unit cancels a reset state of the input node, and the output unit performs a plurality of outputs while the accumulation state of the charge accumulation unit is maintained, and wherein in the second operation, the reset unit cancels the reset state of the input node, and the output unit performs a first output while the accumulation state of the charge accumulation unit is maintained, the charge transfer unit subsequently transfers the charges from the charge accumulation unit to the input node, and the output unit subsequently performs a second output.

According to the present invention, a driving apparatus having a higher degree of flexibility can be provided.

Further features of the present invention will become apparent from the following description of exemplary embodiments with reference to the attached drawings

BRIEF DESCRIPTION OF THE DRAWINGS

FIG. 4 illustrates a truth table of D-FF 3235 according to the first embodiment;

FIG. 5 illustrates a truth table of a transfer signal generation unit according to the first embodiment;

FIGS. 6A and 6B illustrate timing charts of driving methods for readout operations according to the first embodiment;

FIG. 11 illustrates a truth table of D-FF3235 according to the second embodiment;

DESCRIPTION OF THE EMBODIMENTS

Embodiment 1

An imaging apparatus (photoelectric conversion apparatus) according to the present embodiment acquires a column offset noise unique to each column circuit and uses the acquired column offset noise as data for generating a correction value. The column offset noise can be acquired by reading out a signal more than once without transferring a charge to a floating diffusion and obtaining a difference between the readout signals. This readout operation is referred to as an "N-N readout" in the present embodiment. Since the N-N readout does not involve charge transfer to the floating diffusion from a photoelectric conversion element, the N-N readout can be performed while the photoelectric conversion element accumulates charges.

The imaging apparatus according to the present embodiment can perform the N-N readout operation during a charge accumulation period and a charge non-accumulation period.

(Configuration of Imaging Apparatus)

Figure 1:
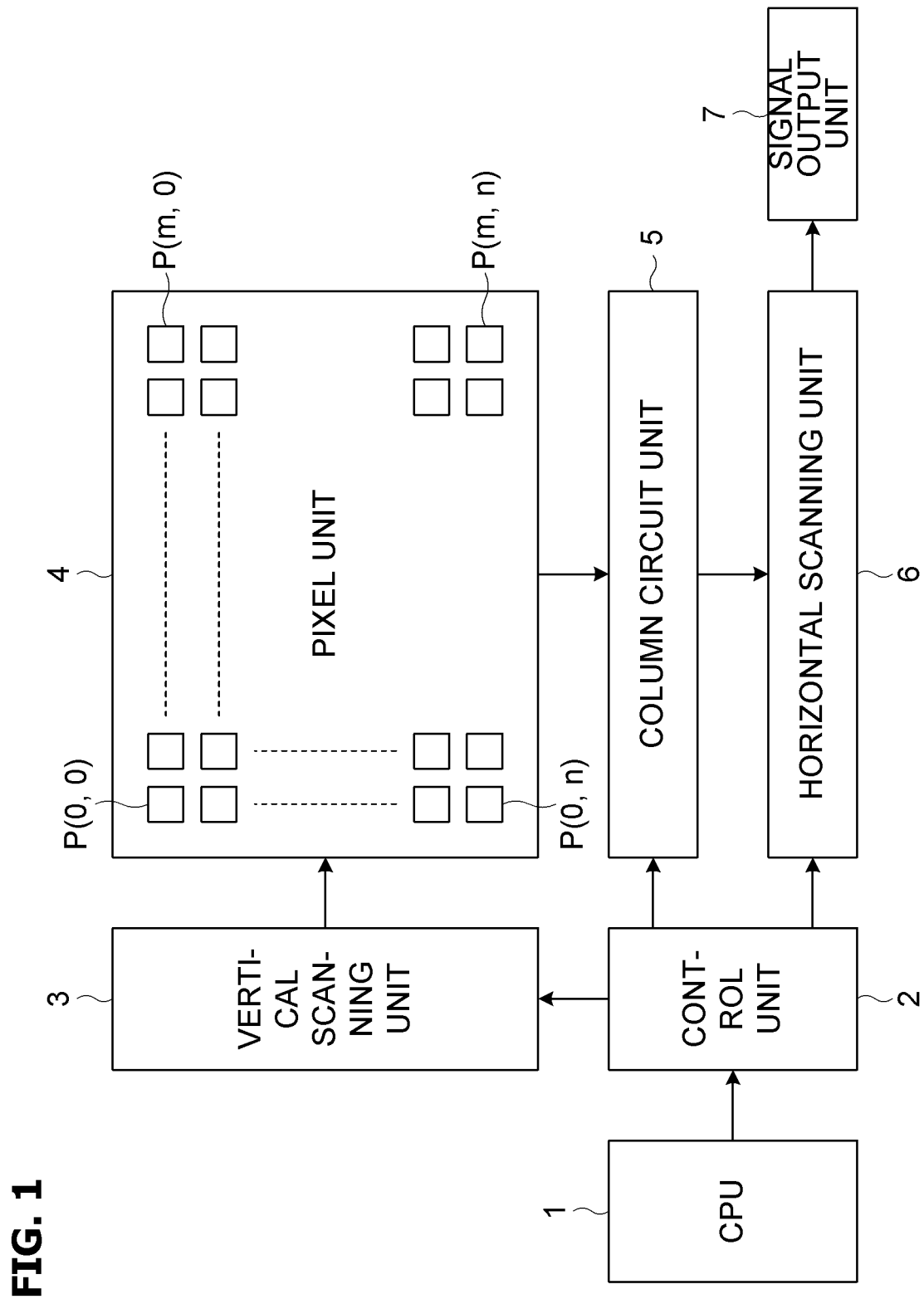
FIG. 1 illustrates a configuration of an imaging apparatus according to a first embodiment.

FIG. 1 schematically illustrates a configuration of the imaging apparatus (photoelectric conversion apparatus) according to the first embodiment. The imaging apparatus includes a CPU 1, a control unit 2, a vertical scanning unit 3, a pixel unit 4, a column circuit unit 5, a horizontal scanning unit 6, and a signal output unit 7.

The CPU 1 controls the imaging apparatus by executing a program. The CPU 1 may be arranged in an imaging system in which the imaging apparatus is mounted, namely, outside the imaging apparatus.

The control unit 2 is a control circuit that supplies a control signal to the vertical scanning unit 3, the column circuit unit 5, and the horizontal scanning unit 6, when receiving a control signal such as a synchronization signal and a setting signal such as an operation mode from the CPU 1.

When receiving the control signal from the control unit 2, the vertical scanning unit 3 performs electronic shutter scanning and readout scanning of the pixel unit 4. The electronic shutter scanning refers to an operation in which a reset state of photoelectric conversion elements in individual pixels in a part of or all of the rows of the pixel unit 4 is sequentially cancelled and a charge accumulation state is set so that exposure thereof is started. The readout scanning refers to an operation in which the pixels in a part of or all of the rows of the pixel unit 4 are caused to sequentially output signals based on charges accumulated in the respective photoelectric conversion elements. The vertical scanning unit 3 corresponds to a driving apparatus that outputs a drive signal to a pixel unit. The drive signal drives the pixel unit 4 per row.

The pixel unit 4 includes a plurality of pixels P (0, 0) to P (m, n) arranged in a matrix of (n+1) rows and (m+1) columns. A row direction refers to a horizontal direction in the drawing, and a column direction refers to a vertical direction in the drawing. In addition, subscript values inside the parentheses of a pixel P (m, n) indicate a column number and a row number in this order. The leading row number is the 0-th row, and the leading column number is the 0-th column.

The column circuit unit 5 includes an amplifier circuit, an analog-to-digital conversion (hereinafter, referred to as "AD conversion") circuit, and a memory. The column circuit unit 5 amplifies a signal read out from the pixel unit 4, performs AD conversion on the amplified signal, and holds the converted signal in the memory as a digital signal.

When receiving a control signal from the control unit 2, the horizontal scanning unit 6 sequentially scans and outputs a signal held in the memory of the column circuit unit 5.

The signal output unit 7 includes a digital processing unit, a parallel-to-serial conversion circuit, and an output circuit such as a low voltage differential signaling (LVDS). The signal output unit 7 performs digital processing on a signal output from the horizontal scanning unit 6 and outputs the processed signal to the outside of the imaging apparatus as serial data.

The AD conversion function is not an essential function for the column circuit unit 5. For example, the configuration may be modified to perform the AD conversion outside the imaging apparatus. In this case, the configuration of the horizontal scanning unit 6 and the signal output unit 7 are appropriately modified to adapt analog signal processing.

(Pixel Unit 4)

Figure 2:
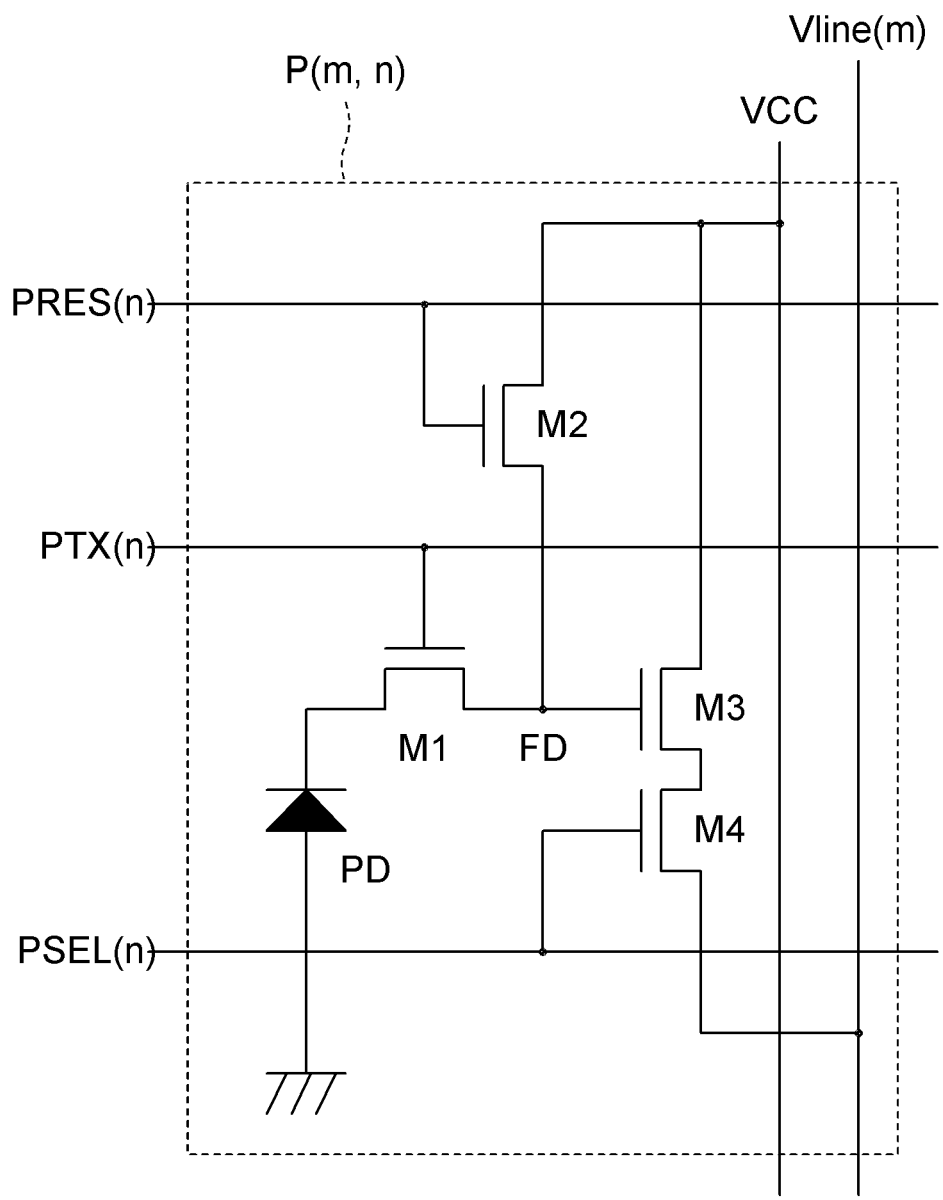
FIG. 2 illustrates a pixel circuit according to the first embodiment.

FIG. 2 illustrates a circuit diagram of a pixel P included in the pixel unit 4 according to the first embodiment. In FIG. 2, a pixel P (m, n) represents a pixel arranged in the n-th row and the m-th column of the pixel unit 4. The pixel P includes a photodiode (hereinafter, referred to as "PD"), a floating diffusion (hereinafter, referred to as "FD"), a transfer transistor M1, a reset transistor M2, an amplification transistor M3, and a selection transistor M4. Pixels arranged in the peripheral area of the pixel unit 4 are optical black (OB) pixels that are entirely shielded so as to prevent light from entering.

The PD is a photoelectric conversion element that performs photoelectric conversion to generate and accumulate charges corresponding to incident light. The transfer transistor M1 transfers the charges from the PD to the FD that is an input node of the amplification transistor M3. The FD holds the charges transferred via the transfer transistor M1. The reset transistor M2 resets the voltage of the FD to a predetermined voltage. The amplification transistor M3 outputs a signal based on a potential of the FD that varies depending on the transferred charges, to the m-th vertical output line Vline (m) via the selection transistor M4.

The photoelectric conversion element PD corresponds to a photoelectric conversion unit that performs photoelectric conversion. In addition, the photoelectric conversion element PD also corresponds to a charge accumulation unit that accumulates charges. The amplification transistor M3 corresponds to an output unit that performs outputting based on a potential of an input node (the floating diffusion FD). The transfer transistor M1 corresponds to a charge transfer unit that transfers charges to the input node from the charge accumulation unit.

The drains of the reset transistor M2 and the amplification transistor M3 are electrically connected to a pixel power source VCC. The source of the amplification transistor M3 is electrically connected to a current source (not illustrated) via the selection transistor M4 and the vertical output line Vline (m) and operates as a source follower circuit. Namely, the amplification transistor M3 is able to output a signal based on a potential of the FD connected to the gate terminal.

While the individual transistor is composed of an N-channel transistor, the transistor may be composed of a P-channel transistor.

A signal PTX (n) is a signal for controlling the transfer transistor M1 in the n-th row and is input to the gate of the transfer transistor M1. A signal PRES (n) is a signal for controlling the reset transistor M2 in the n-th row and is input to the gate of the reset transistor M2. A signal PSEL (n) is a signal for controlling the selection transistor M4 in the n-th row and is input to the gate of the selection transistor M4. The signals PTX(n), PRES(n), and PSEL(n) are generated and input by the vertical scanning unit 3.

The individual transistor is set to a conductive state when a high-level signal is input to the gate and set to a non-conductive state when a low-level signal is input to the gate. Further, a high level corresponds to a logic value "1", and a low level corresponds to a logic value "0".

When the transfer transistor M1 is in a non-conductive state, the photoelectric conversion element PD is in a charge accumulation state in which charges generated by the photoelectric conversion are accumulated. In contrast, when the transfer transistor M1 is in a conductive state, the photoelectric conversion element PD is in a charge non-accumulation state in which charges are not accumulated, namely, in a reset state. When the reset transistor M2 is in a conductive state, the floating diffusion FD is in a reset state. The transfer transistor M1 and the reset transistor M2 correspond to reset units. The reset of the photoelectric conversion element PD may be controlled by a transistor connecting the photoelectric conversion element PD to a power supply voltage.

(Vertical Scanning Unit 3)

Figure 3:
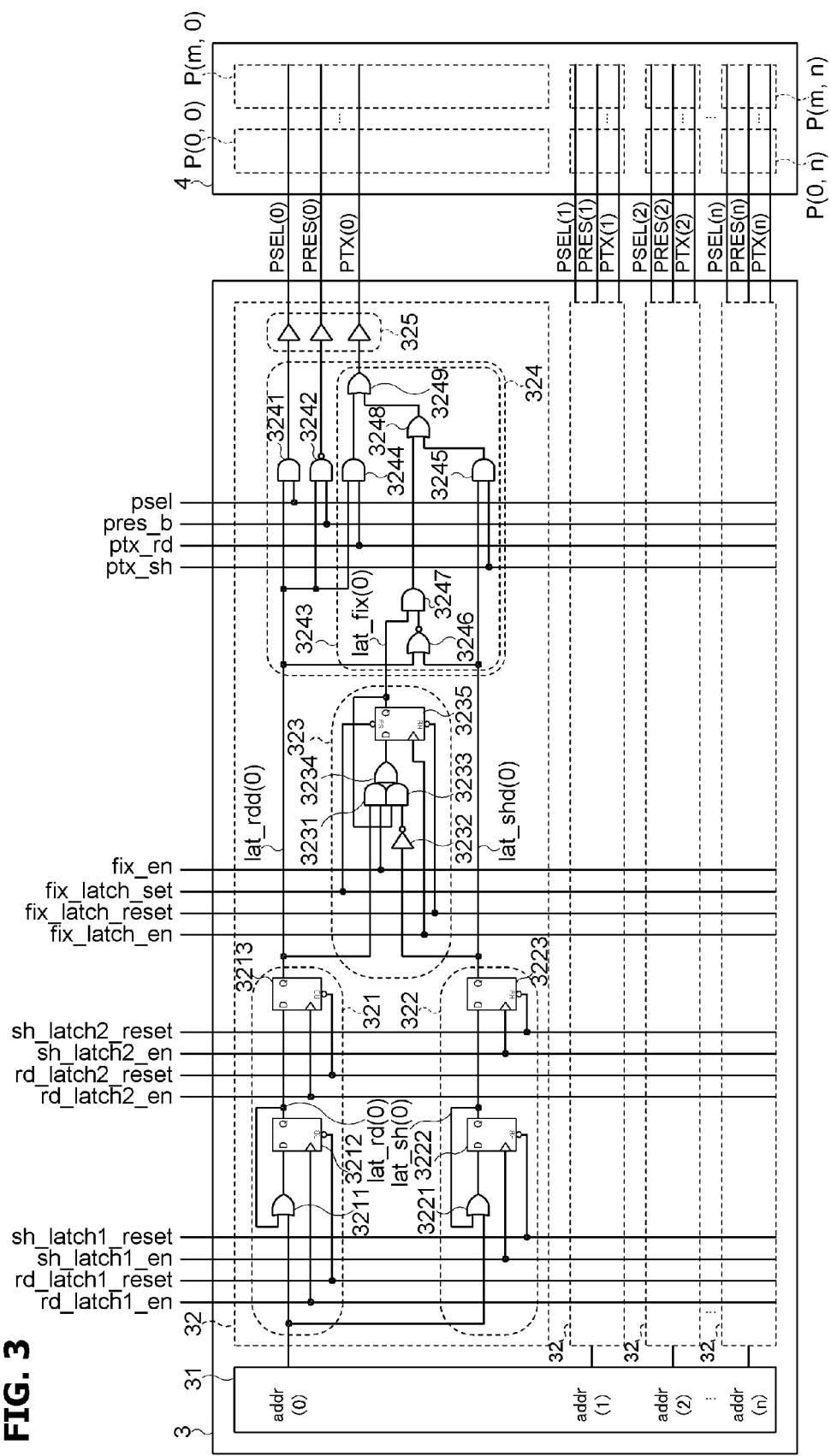
FIG. 3 illustrates a configuration of a vertical scanning unit according to the first embodiment.

FIG. 3 illustrates a configuration of the vertical scanning unit 3 according to the first embodiment. The vertical scanning unit 3 includes an address decoder unit 31 and (n+1) row driving units 32 arranged to correspond to the respective rows of the pixel unit 4.

The address decoder unit 31 decodes an address signal vaddr generated by the control unit 2 to generate decode signals addr(0) to addr(n) and outputs the decode signals to the respective row driving units 32. The address signal vaddr is a signal indicating the row number of a row to be driven in the pixel unit 4, and the decode signals addr(0) to addr(n) are signals for selecting the row driving unit 32 that corresponds to the row to be driven in the pixel unit 4. In other words, the address decoder unit 31 is a scanning unit that selectively supplies a signal to the row driving unit 32 that corresponds to the row to be driven in the pixel unit 4.

The row driving unit 32 includes a first memory unit 321, a second memory unit 322, a third memory unit 323, a pixel drive signal generation unit 324, and a level shifter 325. Signals rd_latch1_en, rd_latch1_reset, sh_latch1_en, sh_latch1_reset, rd_latch2_en, rd_latch2_reset, sh_latch2_en, sh_latch2_reset, fix_latch_en, fix_latch_reset, fix_latch_set, and fix_en are generated in the control unit 2 and input to the vertical scanning unit 3. In addition, signals ptx_sh, ptx_rd, pres_b, and psel are also generated in the control unit 2 and input to the vertical scanning unit 3. These signals are commonly used in (n+1) row driving units 32.

In the following description, while the configuration of the row driving unit 32 that corresponds to the 0-th row will mainly be described, the individual row driving units 32 that correspond to the other rows are assumed to have the same configuration.

[First Storage Unit 321]

The first memory unit 321 includes an OR circuit 3211, a D flip-flop (hereinafter, referred to as "D-FF") 3212, and a D-FF3213.

A decode signal addr(0) output from the address decoder unit 31 is input to one terminal of the OR circuit 3211. A signal lat_rd(0) is input to the other input terminal of the OR circuit 3211. The signal lat_rd(0) is an output signal output from an output terminal Q of the D-FF3212. Thus, a logical sum of the decode signal addr(0) and the signal lat_rd(0) is output form the OR circuit 3211 and input to an input terminal D of the D-FF3212. In addition, the rd_latch1_en is connected to a clock terminal of the D-FF3212, and the rd_latch1_reset is connected to a reset terminal of the D-FF3212. The signal lat_rd(0) is input to an input terminal D of the D-FF3213. In addition, the rd_latch2_en is connected to a clock terminal of the D-FF3213, and the rd_latch2_reset is connected to a reset terminal of the D-FF3213.

When the rd_latch1_en is at a high level, if any one of the decode signal addr(0) and the signal lat_rd(0) is at a high level, the D-FF3212 stores "1". Next, if the rd_latch2_en is set to a high level, the D-FF3213 stores "1". An output signal from an output terminal Q of the D-FF3213, namely, a signal lat_rdd(0) output from the first memory unit 321 is input to the third memory unit 323 and the pixel drive signal generation unit 324.

The signal lat_rdd(0) is used to select a row in which signals are read out from the pixel unit 4. Namely, the signal lat_rdd(0) is used to select a row in which a readout operation is to be performed. The high-level signal lat_rdd (0) corresponds to a first signal, which is a signal for instructing the pixels in a corresponding row to read out signals.

[Second Storage Unit 322]

The second memory unit 322 includes an OR circuit 3221, a D-FF3222, and a D-FF3223.

A decode signal addr(0) output from the address decoder unit 31 is input to one terminal of the OR circuit 3221. A signal lat_sh(0) is input to the other input terminal of the OR circuit 3221. The signal lat_sh(0) is an output signal output from an output terminal Q of the D-FF3222. Thus, a logical sum of the decode signal addr(0) and the signal lat_sh(0) is output from the OR circuit 3221 and input to an input terminal D of the D-FF3222. In addition, the sh_latch1_en is connected to a clock terminal of the D-FF3222, and the sh_latch1_reset is connected to a reset terminal of the D-FF3222. The signal lat_sh(0) is input to an input terminal D of the D-FF3223. In addition, the sh_latch2_en is connected to a clock terminal of the D-FF3223, and the sh_latch2_reset is connected to a reset terminal of the D-FF3223.

When the sh_latch1_en is at a high level, if any one of the decode signal addr(0) and the signal lat_sh(0) is at a high level, the D-FF3222 stores "1". Next, when the sh_latch2_en is set to a high level, the D-FF3223 stores "1". An output signal from an output terminal Q of the D-FF3223, namely, a signal lat_shd(0) output from the second memory unit 322 is input to the third memory unit 323 and the pixel drive signal generation unit 324.

The signal lat_shd(0) is used to select a row in which the photoelectric conversion element of each of the pixels in the pixel unit 4 is reset, and subsequently, the reset state thereof is cancelled to set a charge accumulation state. Namely, the signal lat_shd(0) is used to select a row in which an electronic shutter operation is to be performed. The high-level signal lat_shd(0) corresponds to a second signal, which is a signal for instructing the pixels in a corresponding row to perform the shutter operation.

[Third Storage Unit 323]

The third memory unit 323 includes an AND circuit 3231, a NOT circuit 3232, an AND circuit 3233, an OR circuit 3234, and a D-FF3235.

The signal lat_rdd(0) output from the first memory unit 321 is input to one terminal of the AND circuit 3231. The signal fix_en is input to the other input terminal of the AND circuit 3231. Thus, a logical product of the signal lat_rdd(0) and the signal fix_en is output from the AND circuit 3231. The signal lat_shd(0) output from the second memory unit 322 is input to the NOT circuit 3232. Thus, an inverted signal of the signal lat_shd(0) is output from the NOT circuit 3232 and input to one input terminal of the AND circuit 3233. A signal lat_fix(0) is input to the other input terminal of the AND circuit 3233. The signal lat_fix(0) is an output signal output from an output terminal Q of the D-FF3235. Thus, a logical product of the inverted signal of the signal lat_shd(0) and the signal lat_fix(0) is output from the AND circuit 3233.

An output signal of the AND circuit 3231 is input to one terminal of the OR circuit 3234. An output signal of the AND circuit 3233 is input to the other terminal of the OR circuit 3234. Thus, a logical sum of the output signal of the AND circuit 3231 and the output signal of the AND circuit 3233 is output from the OR circuit 3234 and input to an input terminal D of the D-FF3235.

The fix_latch_en is connected to a clock terminal of the D-FF3235, the fix_latch_reset is connected to a reset terminal of the D-FF3235, and the fix_latch_set is connected to a set terminal of the D-FF3235.

The signal lat_fix(0) output from the output terminal Q of the D-FF3235, namely, from the third memory unit 323 is input to the pixel drive signal generation unit 324. The signal lat_fix(0) corresponds to a third signal, which is a signal for maintaining the pixels in a corresponding row in either the charge accumulation state or the reset state. The signal fix_en corresponds to a fourth signal, which is a signal for allowing the D-FF3235 in the third memory unit 323 to be updated.

FIG. 4 illustrates a truth table of input values to the D-FF3235 according to the first embodiment. This truth table indicates input values to the D-FF3235 with respect to the values of the signals lat_rdd(x) and lat_shd(x). In this table, "1" set to the signal lat_rdd(x) indicates that a corresponding row is a row in which readouts from the pixels are performed, and "0" set to the signal lat_rdd(x) indicates that a corresponding row is a row in which the readouts are not performed. Further, "1" set to the signal lat_shd(x) indicates that a corresponding row is a row in which an electronic shutter is performed, and "0" set to the signal lat_shd(x) indicates that a corresponding row is a row in which the electronic shutter is not performed.

If the signal lat_rdd(x) is "1" and the signal lat_shd(x) is "1", the signal fix_en is input to the D-FF3235. If the signal lat_rdd(x) is "1" and the signal lat_shd(x) is "0", a logical sum of the signal fix_en and the signal lat_fix(x) is input.

If the signal lat_rdd(x) is "0" and the signal lat_shd(x) is "1", "0" is input to the D-FF3235. If the signal lat_rdd(x) is "0" and the signal lat_shd(x) is "0", the signal lat_fix(x) is input.

When the output signal lat_rdd(x) of the first memory unit 321 is at a high level, if the signal fix_en is at a high level, the third memory unit 323 can hold "1", which is a state A. Namely, whether to cause the state of the third memory unit 323 to transition to the state A can be selected based on the signal fix_en. When the third memory unit 323 holds "1" as the state A, if the output signal lat_shd(x) of the second memory unit 322 is at a low level, the third memory unit 323 continues to hold the state A. If the output signal lat_shd(x) of the second memory unit 322 is at a high level, the third memory unit 323 can hold "0", which is a state B.

The state of the third memory unit 323 (D-FF3235) is controlled by combination logic circuits including the AND circuit 3231, the NOT circuit 3232, the AND circuit 3233, and the OR circuit 3234. The combination logic circuits including the AND circuit 3231, the NOT circuit 3232, the AND circuit 3233, and the OR circuit 3234 correspond to a selection unit that selects whether to cause the state of the signal held in the D-FF3235 to transition. When the signal lat_rdd(0) for instructing the readout is input, the selection unit selects whether to cause the state of the third memory unit 323 to transition, based on the level of the signal fix_en. Specifically, if the signal fix_en is at a high level, the selection unit transmits the signal lat_rdd(0) to the D-FF3235 via the AND circuit 3231. As a result, the state of the D-FF3235 transitions to the state A, namely, the state in which the D-FF3235 holds "1", which is a signal for setting the pixels to the reset state. If the signal fix_en is at a low level, even if the high-level signal lat_rdd(0) is input to the selection unit, an output of the selection unit becomes a low level. Consequently, the D-FF3235 is maintained in the state B, namely, the state in which the D-FF3235 holds "0", which is a signal for setting the pixels to the charge accumulation state. In addition, when the signal lat_rdd(0) for instructing the readout is at a low level, if the high-level signal lat_shd(0) for instructing the shutter operation is input, the selection unit causes the D-FF3235 to transition to the state B, which is the state in which the D-FF3235 holds "0". In the state B, the D-FF3235 holds the signal for maintaining the pixels in the charge accumulation state.

When the pixel P is neither in the state in which the shutter operation is performed nor in the state in which the readout operation is performed, the signal lat_fix(0) output from the third memory unit 323 is used as a control signal for the transfer transistor M1 of the pixel P. In other words, when both the signal lat_rdd(0) and the signal lat_shd(0) are at a low level, the signal lat_fix(0) serves as a signal for controlling the transfer transistor M1 of the pixel P. By controlling the transfer transistor M1 by the signal lat_fix(0), the PD is maintained in the charge accumulation state or the reset state. As will be described below, when in the state A, namely, when the signal lat_fix(0) is at a high level, since the transfer transistor M1 is set to a conductive state, the PD is maintained in the reset state. In contrast, when in the state B, namely, when the signal lat_fix(0) is at a low level, since the transfer transistor M1 is set to a non-conductive state, the PD is maintained in the charge accumulation state.

The case in which the pixel P is neither in the state in which the electronic shutter operation is performed nor in the state in which the readout operation is performed refers to the charge accumulation period after the electronic shutter operation and a period after the readout operation excluding the charge accumulation period.

In the present embodiment, by continuously fixing the PD of the pixel P to the reset state during the period after the readout operation excluding the charge accumulation period, an impact of the charge spilling over the peripheral pixels can be reduced. In addition, if the signal fix_en is set to a low level when the readout operation is performed during the charge accumulation period, the third memory unit 323 does not transition to the state A. Thus, the PD can be maintained in the charge accumulation state. As described above, the signal fix_en is regarded as a control signal that indicates whether to allow the state of the third memory unit 323 to be updated after the readout operation. In addition, the signal fix_en is also regarded as a signal that controls whether to cause the PD to maintain the state or transition to a reset state after the readout operation.

[Pixel Drive Signal Generation Unit 324]

The pixel drive signal generation unit 324 includes an AND circuit 3241, a NAND circuit 3242, and a transfer signal generation unit 3243. The transfer signal generation unit 3243 includes an AND circuit 3244, an AND circuit 3245, a NOR circuit 3246, an AND circuit 3247, an OR circuit 3248, and an OR circuit 3249.

The signal lat_rdd(0) output from the first memory unit 321, the signal lat_shd(0) output from the second memory unit 322, and the signal lat_fix(0) output from the third memory unit 323 are input to the pixel drive signal generation unit 324. The pixel drive signal generation unit 324 is a combination logic circuit that performs logic operations of these input signals and signals ptx_sh, ptx_rd, pres_b, and psel.

The level shifter 325 is provided downstream of the pixel drive signal generation unit 324. The level shifter 325 is a circuit that converts a voltage level and outputs the result. Each signal whose voltage level has been converted by the level shifter 325 is input to the pixel unit 4.

«PSEL»

The signal lat_rdd(0) output from the first memory unit 321 is input to one input terminal of the AND circuit 3241. The signal psel is input to the other input terminal of the AND circuit 3241. Thus, a logical product of the signal lat_rdd(0) and the signal psel is output from the AND circuit 3241. This output signal is output to the pixel unit 4 as a signal PSEL(0) via the level shifter 325.

«PRES»

Likewise, the signal lat_rdd(0) is input to one input terminal of the NAND circuit 3242. The signal pres_b is input to the other input terminal of the NAND circuit 3242. Thus, an inverted signal of a logical product of the signal lat_rdd(0) and the signal pres_b is output from the NAND circuit 3242. This output signal is output to the pixel unit 4 as a signal PRES(0) via the level shifter 325.

«PTX»

The signal lat_rdd(0) is input to one input terminal of the AND circuit 3244. The signal ptx_rd is input to the other input terminal of the AND circuit 3244. Thus, a logical product of the signal lat_rdd(0) and the signal ptx_rd is output from the AND circuit 3244.

The signal lat_shd(0) output from the second memory unit 322 is input to one input terminal of the AND circuit 3245. The signal ptx_sh is input to the other input terminal of the AND circuit 3245. Thus, a logical product of the signal lat_shd(0) and the signal ptx_sh is output from the AND circuit 3245.

The signal lat_rdd(0) is input to one input terminal of the NOR circuit 3246. The signal lat_shd(0) is input to the other input terminal of the NOR circuit 3246. Thus, an inverted signal of a logical sum of the signal lat_rdd(0) and the lat_shd(0) is output from the NOR circuit 3246.

The signal lat_fix(0) output from the third memory unit 323 is input to one input terminal of the AND circuit 3247. An output signal of the NOR circuit 3246 is input to the other input terminal of the AND circuit 3247. Thus, a logical product of the signal lat_fix(0) and the output signal of the NOR circuit 3246 is output from the AND circuit 3247.

The output signal of the AND circuit 3247 is input to one input terminal of the OR circuit 3248. The output signal of the AND circuit 3245 is input to the other input terminal of the OR circuit 3248. Thus, a logical sum of the output signal of the AND circuit 3247 and the output signal of the AND circuit 3245 is output from the OR circuit 3248.

The output signal of the OR circuit 3248 is input to one input terminal of the OR circuit 3249. The output signal of the AND circuit 3244 is input to the other input terminal of the OR circuit 3249. Thus, a logical sum of the output signal of the OR circuit 3248 and the output signal of the AND circuit 3244 is output from the OR circuit 3249.

The output signal of the OR circuit 3249 is output to the pixel unit 4 as a signal PTX(0) via the level shifter 325.

FIG. 5 is a truth table of the transfer signal generation unit 3243 according to the first embodiment. This truth table indicates output values with respect to the values of the signals lat_rdd(x) and lat_shd(x). In this table, as in FIG. 4, "1" set to the signal lat_rdd(x) indicates that a corresponding row is a row in which readouts from the pixels are performed, and "0" set to the signal lat_rdd(x) indicates that a corresponding row is a row in which the readouts are not performed. In addition, "1" set to the signal lat_shd(x) indicates that a corresponding row is a row in which an electronic shutter is performed, and "0" set to the signal lat_shd(x) indicates that a corresponding row is a row in which the electronic shutter is not performed.

If the signal lat_rdd(x) is "1" and the signal lat_shd(x) is "1", the transfer signal generation unit 3243 outputs a logical sum of the signal ptx_rd and the signal ptx_sh. If the signal lat_rdd(x) is "1" and the signal lat_shd(x) is "0", the transfer signal generation unit 3243 outputs the signal ptx_rd.

If the signal lat_rdd(x) is "0" and the signal lat_shd(x) is "1", the transfer signal generation unit 3243 outputs the signal ptx_sh. If the signal lat_rdd(x) is "0" and the signal lat_shd(x) is "0", the transfer signal generation unit 3243 outputs a signal lat_fix(x).

As described above, when both the signal lat_rdd(x) and the signal lat_shd(x) are "0", the transfer signal generation unit 3243 outputs a signal lat_fix(x). Thus, when the pixel P is neither in the state in which the electronic shutter operation is performed nor in the state in which the readout operation is performed, the transfer transistor M1 of the pixel P is controlled by the signal lat_fix(x). If the third memory unit 323 is in the state A, namely, if the third memory unit 323 holds "1", the transfer transistor M1 of the pixel P is set to a conductive state, and if the third memory unit 323 is in the state B, namely, if the third memory unit 323 holds "0", the transfer transistor M1 of the pixel P is set to a non-conductive state.

(S-N Readout Operation)

FIG. 6A is a timing chart illustrating a driving method of the pixel unit 4 according to the first embodiment. In this driving method, an N-N readout is not performed.

At time t100a, a PSEL(x) and a PTX(x) are at a low level. A PRES(x) is at a high level.

At time t101a, the PTX(x) transitions to a high level, and the transfer transistor M1 is set to a conductive state. As a result, charges accumulated in the PD are drained, and the PD is reset.

At time t102a, the PTX(x) transitions to a low level, and the transfer transistor M1 is set to a non-conductive state. As a result, the PD starts accumulating charges.

After charges are accumulated for a predetermined period of time, at time t103a, the PSEL(x) transitions to a high level. Thus, the selection transistor M4 of each of the pixels P (0, x) to P (m, x) in the x-th row is set to a conductive state, and these pixels are set to a selected state.

At time t104a, the PRES(x) transitions to a low level. When the signal PRES(x) is at a low level, the reset transistor M2 of each of the pixels P(0, x) to P(m, x) is set to a non-conductive state, and the FD is held in a floating state. At this time, the amplification transistor M3 and a constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m).

At time t105a, an AD conversion is started. In this AD conversion, the N signals output to the vertical output lines are AD-converted.

After the N signals have been AD-converted at time t106a, at time t107a, the PTX(x) transitions to a high level, and the transfer transistor M1 is set to a conductive state. As a result, charges generated and accumulated in the PD are transferred to the FD. At this time, a pixel signal (S signal) appears on the vertical output lines Vline(0) to Vline(m).

At time t108a, the PTX(x) transitions to a low level, and the transfer transistor M1 is set to a non-conductive state. This terminates the transfer of the charges generated and accumulated in the PD to the FD.

At time t109a, the AD conversion is started. In this AD conversion, the S signals output to the vertical output lines are AD-converted.

After the S signals have been AD-converted at time t110a, at time t111a, the signal PRES(x) transitions to a high level. Thus, the reset transistor M2 of each of the pixels P(0, x) to P(m, x) is set to a conductive state, and the FD is held in a reset state.

At time t112a, the signal PSEL(x) transitions to a low level. Thus, the selection transistor M4 of each of the pixels P(0, x) to P(m, x) in the x-th row is set to a non-conductive state, and these pixels are set to a non-selected state.

The S signal that has been read out includes a noise signal (N signal) caused by the FD and the amplification transistor M3. In the present embodiment, the noise is reduced by subtracting the N signal from the S signal. In the present embodiment, the present driving method is referred to as "S-N readout".

(N-N Readout Operation)

FIG. 6B is a timing chart illustrating a driving method of the pixel unit 4 according to the first embodiment. In this driving method, a readout (N-N readout) for generating a correction value is performed.

At time t100b, a PSEL(x) and a PTX(x) are at a low level. A PRES(x) is at a high level.

At time t101b, the PTX(x) transitions to a high level, and the transfer transistor M1 is set to a conductive state. As a result, charges accumulated in the PD are drained and the PD is reset.

At time t102b, the PTX(x) transitions to a low level, and the transfer transistor M1 is set to a non-conductive state. As a result, the PD starts accumulating charges.

After charges are accumulated for a predetermined period of time, at time t103b, the PSEL(x) transitions to a high level. Thus, the selection transistor M4 of each of pixels P (0, x) to P (m, x) in the x-th row is set to a conductive state, and these pixels are set to a selected state.

At time t104b, the PRES(x) transitions to a low level. When the signal PRES(x) is at a low level, the reset transistor M2 of each of the pixels P(0, x) to P(m, x) is set to a non-conductive state, and the FD is held in a floating state. At this time, the amplification transistor M3 and a constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m).

At time t105b, an AD conversion is started. In this AD conversion, the N signals output to the vertical output lines are AD-converted. In the present embodiment, the N signal acquired at this time is referred to as a "first N signal".

After the N signals have been AD-converted at time t106b, at time t107b, the AD conversion is started again. The signal AD-converted at this time is not the S signal photoelectrically converted by the PD but the N signal that has been acquired again. The operation of the AD conversion performed at time t106b is the same as that performed when the S signal is read out in the S-N readout operation. In the present embodiment, the N signal acquired at this time is referred to as a "second N signal".

After the second N signals have been AD-converted at time t108b, at time t109b, the signal PRES(x) transitions to a high level. Thus, the reset transistor M2 of each of the pixels P(0, x) to P(m, x) is set to a conductive state, and the FD is held in the reset state.

At time t110b, the signal PSEL(x) transitions to a low level. Thus, the selection transistor M4 of each of the pixels P(0, x) to P(m, x) in the x-th row is set to a non-conductive state, and these pixels are set to a non-selected state.

In the present embodiment, the same N signal is acquired twice by performing the same operation performed in the S-N readout operation, and the first N signal is subtracted from the second N signal. Since the same N signals have been acquired, ideally, the subtraction result will be "0". In practice, however, the subtraction result will not be "0". This is because time (timing) elapsed from the cancellation of the reset state at time t104b is different between the second N signal and the first N signal. This subtraction result is regarded as a unique column offset noise that occurs per column circuit (the vertical output line, the AD converter, etc.) in the S-N readout operation, and this column offset noise is used as data for generating a correction value. In the present embodiment, the present driving method is referred to as "N-N readout".

(Driving Method 1: A Case in which an N-N Readout is not Performed)

Figure 7:
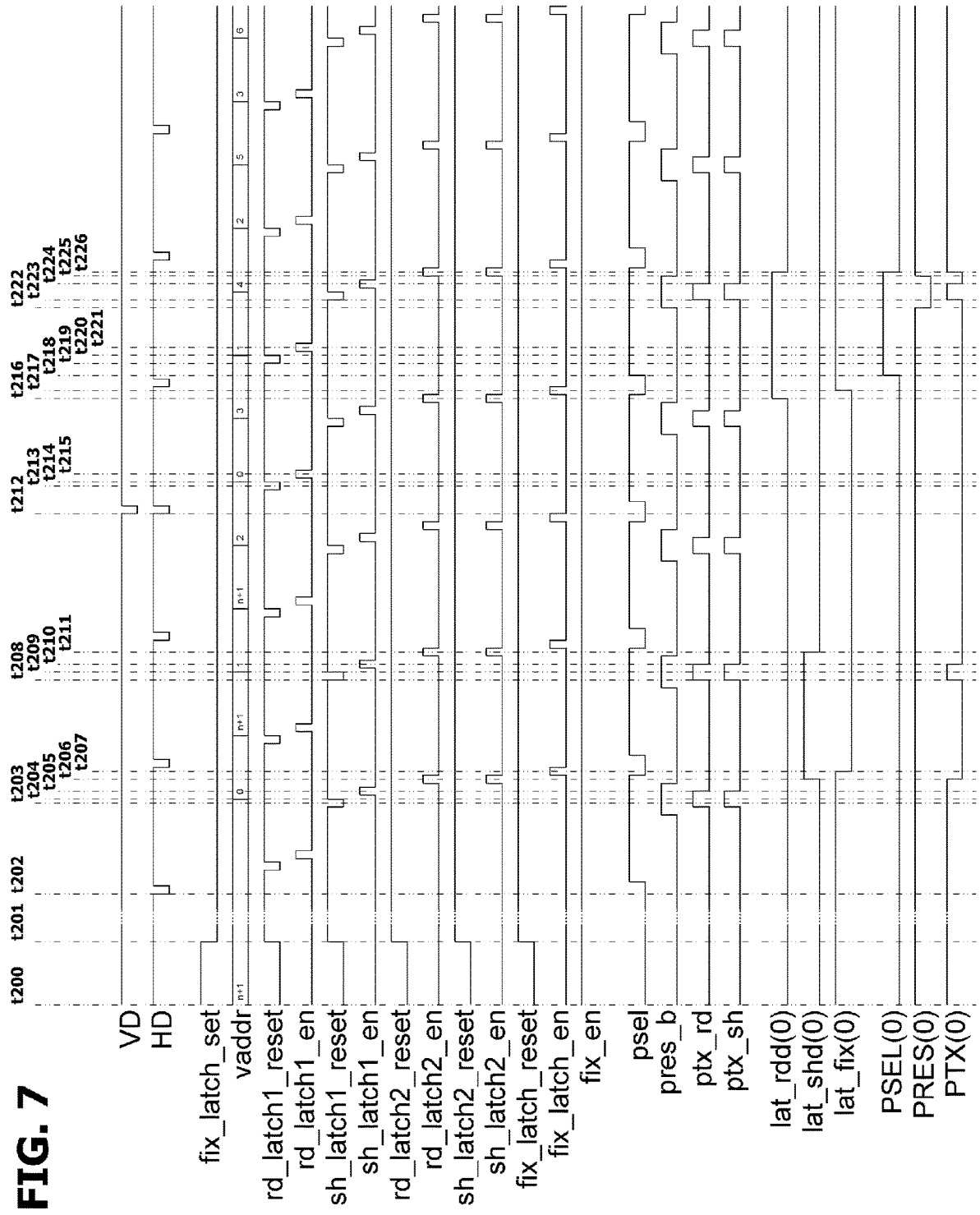
FIG. 7 illustrates a timing chart of a driving method for a case in which an N-N readout operation is not performed according to the first embodiment.

FIG. 7 is a timing chart illustrating a driving method of the vertical scanning unit 3 and the pixel unit 4 according to the first embodiment. In this driving method, an N-N readout is not performed. Hereinafter, operations of the vertical scanning unit 3 and the pixel unit 4 will be described with reference to FIGS. 1 to 7. Description of the change in signal level illustrated in FIG. 7 may be omitted if the change is in a portion that is less relevant to the scanning of the pixel unit 4, a portion where the same operation is repeated, or the like.

[Time t200 to t201]

During a period from time t200 to t201, an initialization operation is performed on the vertical scanning unit 3 and the pixel unit 4. In this initialization operation, based on a signal fix_latch_set input to the third memory unit 323, the FDs in all the rows are reset. First, the initialization operation performed on the vertical scanning unit 3 will be described with reference to FIGS. 3 to 7.

During a period from time t200 to t201, among the signals input from the control unit 2 to the vertical scanning unit 3, signals fix_latch_set and fix_en are at a high level. In addition, the value of an address signal vaddr is "n+1". At this time, all the decode signals addr(0) to addr(n) output from the address decoder unit 31 are at a low level. Other signals input from the control unit 2 to the vertical scanning unit 3, namely, all the signals rd_latch1_reset, rd_latch1_en, sh_latch1_reset, sh_latch1_en, rd_latch2_reset, rd_latch2_en, sh_latch2_reset, sh_latch2_en, fix_latch_reset, fix_latch_en, psel, pres_b, ptx_rd, and ptx_sh are also at a low level.

When the low-level signal rd_latch1_reset is input to the reset terminal RB of the D-FF3212, an output signal of the D-FF3212 becomes a low level. Accordingly, each of the signals lat_rd(0) to lat_rd(n) output from the D-FF3212 in the respective rows becomes a low level.

When the low-level signal rd_latch2_reset is input to the reset terminal RB of the D-FF3213, an output signal of the D-FF3213 becomes a low level. Accordingly, each of the signals lat_rdd(0) to lat_rdd(n) output from the D-FF3213 in the respective rows becomes a low level.

Likewise, when the low-level signal sh_latch1_reset is input to the reset terminal RB of the D-FF3222, an output signal of the D-FF3222 becomes a low level. Accordingly, each of the signals lat_sh(0) to lat_sh(n) output from the D-FF3222 in the respective rows becomes a low level.

When the low-level signal sh_latch2_reset is input to the reset terminal RB of the D-FF3223, an output signal of the D-FF3223 becomes a low level. Accordingly, each of the signals lat_shd(0) to lat_shd(n) output from the D-FF3223 in the respective rows becomes a low level.

When the high-level signal fix_latch_set is input to the set terminal SB of the D-FF3235, an output signal of the D-FF3235 becomes a high level. Accordingly, each of the signals lat_fix(0) to lat_fix(n) output from the D-FF3235 in the respective rows becomes a high level.

Since both the signal lat_rdd(0) and the signal psel are at a low level, a signal PSEL(0), which is a logical product of the signal lat_rdd(0) and the signal psel, becomes a low level. Since both the signal lat_rdd(0) and the signal pres_b are at a low level, a signal PRES(0), which is an inverted signal of a logical product of the signal lat_rdd(0) and the signal pres_b, becomes a high level. In addition, at this time, both the signal lat_rdd(0) and the signal lat_shd(0) are at a low level. Therefore, according to the truth table in FIG. 5, a signal PTX(0) becomes a high level, as with the signal lat_fix(0).

Likewise, signals PSEL(1) to PSEL(n) become a low level, signals PRES(1) to PRES(n) become a high level, and signals PTX(1) to PTX(n) become a high level.

Next, an initialization operation performed on the pixel unit 4 will be described with reference to FIGS. 1 and 2. During a period from time t200 to t201, the signals PRES(0) to PRES(n) are at a high level. Thus, the reset transistor M2 of each of the pixels P is set to a conductive state, and the potential of the FD is initialized based on the potential of the VCC. Further, during the same period, the signals PTX(0) to PTX(n) are also at a high level. Therefore, the transfer transistor M1 of each of the pixels P is also set to a conductive state. As a result, charges accumulated in the PD are drained, and the PD is set to a reset state. In this way, the pixels P in all the rows of the pixel unit 4 are reset.

At time t201, the signal fix_latch_set is set to a low level, and the signals rd_latch1_reset, sh_latch1_reset, rd_latch2_reset, sh_latch2_reset, and fix_latch_reset are set to a high level. The initialization operation performed on the vertical scanning unit 3 and the pixel unit 4 has thus been completed.

[Time t202 to t211]

Next, during a period from time t202 to t211, an electronic shutter operation is performed on each of the pixels P(0, 0) to P(m, 0) in the 0-th row. At time t202, when a low-level pulse of a horizontal synchronization signal HD is input to the control unit 2, the control unit 2 starts control processing for the operation per row.

At around time t203, the control unit 2 causes the signal sh_latch1_reset to transition to a low level and then to a high level. As a result, the D-FF3222 is reset.

At time t204, when the control unit 2 sets the address signal vaddr to "0", the address decoder unit 31 decodes "0" and sets the decode signal addr(0) to a high level.

At around time t205, the control unit 2 causes the signal sh_latch1_en to transition to a high level and then to a low level. At this time, since the signal addr(0) input to the OR circuit 3221 is at a high level, an output of the OR circuit 3221 also becomes a high level. At the timing when the signal sh_latch1_en input to the clock terminal of the D-FF3222 transitions to a high level, the D-FF3222 holds the high-level signal that has been input from the OR circuit 3221 to the data input terminal D of the D-FF3222. As a result, "1" is held in the D-FF3222, and the output signal lat_sh(0) becomes a high level.

At around time t206, the control unit 2 causes the signals rd_latch2_en and sh_latch2_en to transition to a high level and then to a low level. At the timing when the signal sh_latch2_en input to the clock terminal of the D-FF3223 transitions to a high level, the D-FF3223 holds the high-level signal that has been input from the D-FF3222 to the data input terminal D of the D-FF3223. As a result, the signal lat_shd(0) output from the second memory unit 322 becomes a high level. At this time, since the signal lat_shd(0) is at a high level and the signal lat_rdd(0) is at a low level, the transfer signal generation unit 3243 outputs the value of the signal ptx_sh, that is, a low-level signal. Thus, a signal PTX(0) becomes a low level, and the reset state of the PD of each of the pixels P(0, 0) to P(m, 0) in the 0-th row is cancelled.

At around time t207, the control unit 2 causes the signal fix_latch_en to transition to a high level and then to a low level. At this time, the signal lat_rdd(0) is at a low level and the signal lat_shd(0) is at a high level. Therefore, according to the truth table in FIG. 4, the D-FF3235 holds "0", which indicates a reset state, that is, the state B. Thus, a signal lat_fix(0) output from the third memory unit 323 becomes a low level. At this time, however, the signal lat_rdd(0) is at a low level, and the signal lat_shd(0) is at a high level. Therefore, according to the truth table in FIG. 5, the signal PTX(0) maintains the value of the signal ptx_sh, that is, a low-level signal.

At time t208, the control unit 2 causes the signals ptx_rd and ptx_sh to transition to a high level. Since the signal lat_rdd(0) is at a low level and the signal lat_shd(0) is at a high level, and in view of the fact that the signal PTX(0) matches the value of the signal ptx_sh, the signal PTX(0) transitions to a high level. At this time, since the signal PRES(0) input to each of the pixels P(0, 0) to P(m, 0) is at a high level, the reset transistor M2 is in a conductive state. Thus, the potential of the FD is initialized based on the potential of the VCC. Since the signal PTX(0) is also at a high level, the transfer transistor M1 is set to a conductive state. As a result, charges accumulated in the PD are drained, and the PD is reset.

Subsequently, at time t210, the control unit 2 causes the values of the signals ptx_rd and ptx_sh to transition to a low level. When the signal PTX(0) transitions to a low level again, the transfer transistor M1 of each of the pixels P(0, 0) to P(m, 0) is set to a non-conductive state. As a result, the reset state of the PD is cancelled, and the PD is set to a charge accumulation state.

Further, at time t208, the control unit 2 causes the signal sh_latch1_reset to transition to a low level and then to a high level. As a result, the D-FF3222 is reset, and the signal lat_sh(0) becomes a low level.

Subsequently, at time t209, the control unit 2 sets the address signal vaddr to "1". At this time, the address decoder unit 31 sets the decode signal addr(0) to a low level.

At around time t210, the control unit 2 causes the signal sh_latch1_en to transition to a high level and then to a low level. At this time, since the signal lat_sh(0), which is the output signal of the D-FF3222, and the decode signal addr(0) are both at a low level, an output of the OR circuit 3221 becomes a low level. At the timing when the signal sh_latch1_en input to the clock terminal of the D-FF3222 is set to a high level, the D-FF3222 holds the low-level signal that has been input from the OR circuit 3221 to the data input terminal D of the D-FF3222. As a result, "0" is held in the D-FF3222.

At around time t211, the control unit 2 causes the signals rd_latch2_en and sh_latch2_en to transition to a high level and then to a low level. At the timing when the signal sh_latch2_en input to the clock terminal of the D-FF3223 is set to a high level, the D-FF3223 holds the low-level signal that has been input from the D-FF3222 to the data input terminal D of the D-FF3223. As a result, the signal lat_shd (0) output from the second memory unit 322 becomes a low level.

Since the signal lat_shd(0) is at a low level and the signal lat_rdd(0) is also at a low level, the transfer signal generation unit 3243 outputs the value of the signal lat_fix(0), that is, a low-level signal. Thus, the signal PTX(0) becomes a low level, and the PD of each of the pixels P(0, 0) to P(m, 0) maintains the charge accumulation state.

The electronic shutter operation on each of the pixels P(0, 0) to P(m, 0) has thus been completed. Subsequently, similar operations are repeated until the address signal vaddr reaches "n", and the electronic shutter scanning is then completed.

[Time t212 to t226]

Next, during a period from time t212 to t226, an S-N readout operation is performed on the pixels P(0, 0) to P(m, 0) in the 0-th row.

At time t212, when a low-level pulse of a vertical synchronization signal VD is input to the control unit 2, the control unit 2 starts control processing for a readout operation. Each time the horizontal synchronization signal HD is input, the control unit 2 starts control processing for the operation per row, which is the same processing as in the electronic shutter operation.

At around time t213, the control unit 2 causes the signal rd_latch1_reset to transition to a low level and then to a high level. As a result, the D-FF3212 is reset.

At time t214, when the control unit 2 sets the address signal vaddr to "0", the address decoder unit 31 decodes "0" and sets the decode signal addr(0) to a high level.

At around time t215, the control unit 2 causes the signal rd_latch1_en to transition to a high level and then to a low level. At this time, since the signal addr(0) input to the OR circuit 3211 is at a high level, an output of the OR circuit 3211 also becomes a high level. At the timing when the signal rd_latch1_en input to the clock terminal of the D-FF3212 transitions to a high level, the D-FF3212 holds the high-level signal that has been input from the OR circuit 3211 to the data input terminal D of the D-FF3212. As a result, "1" is held in the D-FF3212, and an output signal lat_rd(0) becomes a high level.

At around time t216, the control unit 2 causes the signals rd_latch2_en and sh_latch2_en to transition to a high level and then to a low level. At the timing when the signal rd_latch2_en input to the clock terminal of the D-FF3213 transitions to a high level, the D-FF3213 holds the high-level signal that has been input from the D-FF3212 to the data input terminal D of the D-FF3213. As a result, a signal lat_rdd(0) output from the first memory unit 321 becomes a high level. At this time, since the signal lat_rdd(0) is at a high level and the signal lat_shd(0) is at a low level, the transfer signal generation unit 3243 outputs the value of the signal ptx_rd, that is, a low-level signal. Accordingly, the signal PTX(0) maintains the low level.

At around time t217, the control unit 2 causes the signal fix_latch_en to transition to a high level and then to a low level. At this time, the signal lat_rdd(0) is at a high level and the signal lat_shd(0) is at a low level. Therefore, according to the truth table in FIG. 4, a logical sum of fix_en and lat_fix(0) is input to the D-FF3235. At this time, since the fix_en is "1", the D-FF3235 holds "1", which indicates a reset state, namely, the state A. Thus, a signal lat_fix(0) output from the third memory unit 323 becomes a high level. At this time, however, the signal lat_rdd(0) is at a high level and the signal lat_shd(0) is at a low level. Therefore, according to the truth table in FIG. 5, the signal PTX(0) maintains the value of the signal ptx_rd, that is, a low-level signal.

At time t218, the control unit 2 causes the signal psel to transition to a high level. At this time, since the signal lat_rdd(0) and the signal psel, which are input to the AND circuit 3241, are both at a high level, an output of the AND circuit 3241, which is a logical product of these signals, also becomes a high level. Accordingly, the signal PSEL(0) transitions to a high level. Thus, the selection transistor M4 of each of the pixels P (0, 0) to P (m, 0) in the 0-th row is set to a conductive state, and these pixels are set to a selected state.

At time t222, the control unit 2 causes the signal pres_b to transition to a high level. At this time, since the signal lat_rdd(0) is at a high level, an output of the NAND circuit 3242, which is an inverted signal of a logical product of the signal pres_b and the signal lat_rdd(0), becomes a low level. Accordingly, the signal PRES(0) transitions to a low level. When the signal PRES(0) is at the low level, the reset transistor M2 of each of the pixels P(0, 0) to P(m, 0) is set to a non-conductive state, and the FD is held in a floating state. At this time, the amplification transistor M3 and a constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m). The control unit 2 controls the column circuit unit 5 to read out the noise signal that has appeared on the vertical output lines Vline(0) to Vline(m).

At time t223, the control unit 2 causes the signals ptx_rd and ptx_sh to transition to a high level. Since the signal lat_rdd(0) is at a high level and the signal lat_shd(0) is at a low level, and in view of the fact that the signal PTX(0) matches the value of the signal ptx_rd, the signal PTX(0) transitions to a high level. As a result, the transfer transistor M1 of each of the pixels P(0, 0) to P(m, 0) is set to a conductive state, and charges generated and accumulated in the PD are transferred to the FD.

Subsequently, at time t224, the control unit 2 causes the values of the signals ptx_rd and ptx_sh to transition to a low level. Accordingly, the signal PTX(0) transitions to a low level again. As a result, the transfer transistor M1 of each of the pixels P(0, 0) to P(m, 0) is set to a non-conductive state. This terminates the transfer of the charges accumulated in the PD to the FD. Subsequently, the amplification transistor M3 and the constant current source (not illustrated) operate as a source follower, and a pixel signal (S signal) corresponding to the charge held in the FD is output to the vertical output lines Vline(0) to Vline(m). The control unit 2 controls the column circuit unit 5 to read out the pixel signal that has appeared on the vertical output lines Vline(0) to Vline(m).

At time t219, the control unit 2 causes the signal rd_latch1_reset to transition to a low level and then to a high level. As a result, the D-FF3212 is reset, and the signal lat_rd(0) is set to a low level.

Subsequently, at time t220, the control unit 2 sets the address signal vaddr to "1". At this time, the address decoder unit 31 sets the decode signal addr(0) to a low level.

At around time t221, the control unit 2 causes the signal rd_latch1_en to transition to a high level and then to a low level. At this time, since the signal lat_rd(0), which is the output signal of the D-FF3212, and the decode signal addr(0) are both at a low level, an output of the OR circuit 3211 becomes a low level. At the timing when the signal rd_latch1_en input to the clock terminal of the D-FF3212 is set to a high level, the D-FF3212 holds the low-level signal that has been input from the OR circuit 3211 to the data input terminal D of the D-FF3212. As a result, "0" is held in the D-FF3212.

At time t225, the control unit 2 causes the signal pres_b to transition to a low level. The signal PRES(0) transitions to a high level, the reset transistor M2 of each of the pixels P(0, 0) to P(m, 0) is set to a conductive state, and the FD is set to a reset state.

At around time t226, the control unit 2 causes the signals rd_latch2_en and sh_latch2_en to transition to a high level and then to a low level. At the timing when the signal rd_latch2_en input to the clock terminal of the D-FF3213 is set to a high level, the D-FF3213 holds the low-level signal that has been input from the D-FF3212 to the data input terminal D of the D-FF3213. As a result, a signal lat_rdd(0) output from the first memory unit 321 becomes a low level.

Since the signal lat_rdd(0) is at a low level, an output of the AND circuit 3241 becomes a low level. Accordingly, the signal PSEL(0) transitions to a low level. Thus, the selection transistor M4 is set to a non-conductive state, and each of the pixels P(0, 0) to P(m, 0) is set to a non-selected state. Since the signal lat_shd(0) is at a low level and the signal lat_rdd (0) is also at a low level, the transfer signal generation unit 3243 outputs the value of the signal lat_fix(0), that is, a high-level signal. Thus, the signal PTX(0) becomes a high level, the transfer transistor M1 of each of the pixels P(0, 0) to P(m, 0) is set to a conductive state, and the PD maintains the reset state again.

The readout operation on each of the pixels P(0, 0) to P(m, 0) has thus been completed. Subsequently, similar operations are repeated until the address signal vaddr reaches "n", and the readout scanning is then completed.

(Driving Method 2: A Case in which an N-N Readout is Performed During a Charge Accumulation Period)

Figure 8:
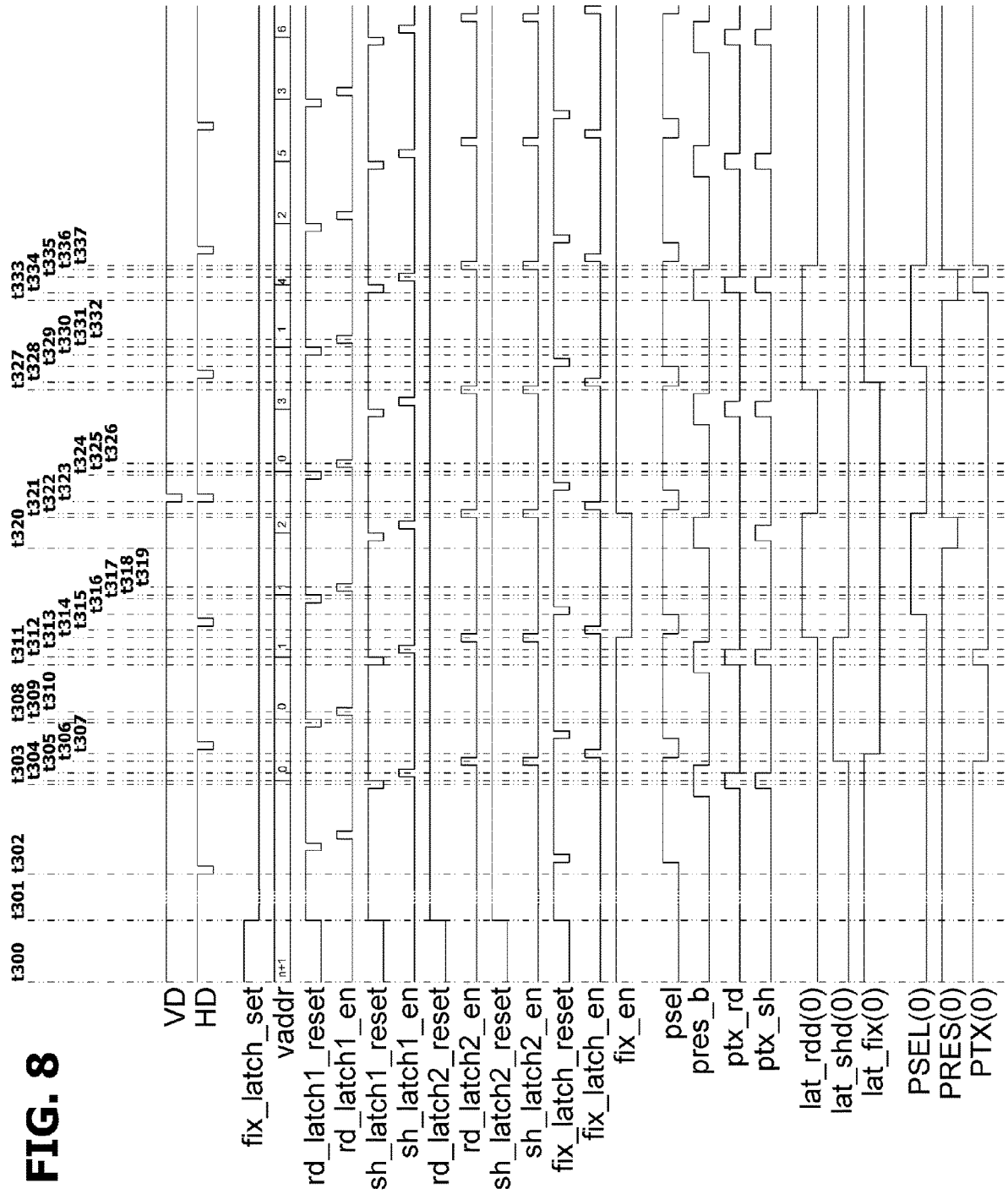
FIG. 8 illustrates a timing chart of a driving method for a case in which an N-N readout operation is performed during a charge accumulation period according to the first embodiment.

FIG. 8 is a timing chart illustrating a driving method of the vertical scanning unit 3 and the pixel unit 4 according to the first embodiment. In this driving method, an N-N readout operation is performed during a charge accumulation period. Hereinafter, operations of the vertical scanning unit 3 and the pixel unit 4 will be described with reference to FIGS. 1 to 8. Description of the change in signal level illustrated in FIG. 8 may be omitted if the change is in a portion that is less relevant to the scanning of the pixel unit 4, a portion where the same operation is repeated, or the like.

[Time t300 to t301]

During a period from time t300 to t301, an initialization operation is performed on the vertical scanning unit 3 and the pixel unit 4. Since this initialization operation is the same as that performed in the period from time t200 to t201 in FIG. 7, description thereof will be omitted.

[Time t302 to t307, t311 to t314]

Next, during a period from time t302 to t307 and a period from time t311 to t314, an electronic shutter operation is performed on each of the pixels P(0, 0) to P(m, 0) in the 0-th row. Since this electronic shutter operation is the same as that performed in the period from time t202 to t211 in FIG. 7, description thereof will be omitted.

[Time t308 to t310, t314 to t322]

During a period from time t308 to t310 and a period from time t314 to t322, an N-N readout operation is performed on each of the pixels P(0, 0) to P(m, 0) in the 0-th row. Each time the horizontal synchronization signal HD is input, the control unit 2 starts control processing for the operation per row, which is the same processing as in the electronic shutter operation.

At around time t308, the control unit 2 causes the signal rd_latch1_reset to transition to a low level and then to a high level. As a result, the D-FF3212 is reset.

At time t309, when the control unit 2 sets the address signal vaddr to "0", the address decoder unit 31 decodes "0" and sets the decode signal addr(0) to a high level.

At around time t310, the control unit 2 causes the signal rd_latch1_en to transition to a high level and then to a low level. At this time, since the signal addr(0) input to the OR circuit 3211 is at a high level, an output of the OR circuit 3211 also becomes a high level. At the timing when the signal rd_latch1_en input to the clock terminal of the D-FF3212 transitions to a high level, the D-FF3212 holds the high-level signal that has been input from the OR circuit 3211 to the data input terminal D of the D-FF3212. As a result, "1" is held in the D-FF3212, and an output signal lat_rd(0) becomes a high level.

At around time t314, the control unit 2 causes the signals rd_latch2_en and sh_latch2_en to transition to a high level and then to a low level. At the timing when the signal rd_latch2_en input to the clock terminal of the D-FF3213 transitions to a high level, the D-FF3213 holds the high-level signal that has been input from the D-FF3212 to the data input terminal D of the D-FF3213. As a result, a signal lat_rdd(0) output from the first memory unit 321 becomes a high level. At this time, since the signal lat_rdd(0) is at a high level and the signal lat_shd(0) is at a low level, the transfer signal generation unit 3243 outputs the value of the signal ptx_rd, that is, a low-level signal. Accordingly, the signal PTX(0) maintains the low level.

In addition, at time t314, the control unit 2 causes the signals fix_en to transition to a low level. In the present embodiment, during the period in which the signal fix_en is at a low level, the control unit 2 performs processing for maintaining the signal ptx_rd at the low level. However, the processing for maintaining the signal ptx_rd at the low level during the period in which the signal fix_en is at the low level is not necessarily performed by the control unit 2. For example, this processing may be performed inside the vertical scanning unit 3.

At around time t315, the control unit 2 causes the signal fix_latch_en to transition to a high level and then to a low level. At this time, the signal lat_rdd(0) is at a high level and the signal lat_shd(0) is at a low level. Therefore, according to the truth table in FIG. 4, a logical sum of fix_en and lat_fix(0) is input to the D-FF3235. At this time, since both the fix_en and the lat_fix(0) are "0", the D-FF3235 holds "0", which indicates a charge accumulation state, namely, the state B. Thus, a signal lat_fix(0) output from the third memory unit 323 maintains the low level. At this time, however, the signal lat_rdd(0) is at a high level and the signal lat_shd(0) is at a low level. Therefore, according to the truth table in FIG. 5, the signal PTX(0) maintains the value of the signal ptx_rd, that is, a low-level signal.

At time t316, the control unit 2 causes the signal psel to transition to a high level. At this time, since the signal lat_rdd(0) and the signal psel, which are input to the AND circuit 3241, are both at a high level, an output of the AND circuit 3241, which is a logical product of these signals, also becomes a high level. Accordingly, the signal PSEL(0) transitions to a high level. Thus, the selection transistor M4 of each of the pixels P (0, 0) to P (m, 0) in the 0-th row is set to a conductive state, and these pixels are set to a selected state.

At time t320, the control unit 2 causes the signal pres_b to transition to a high level. At this time, since the signal lat_rdd(0) is at a high level, an output of the NAND circuit 3242, which is an inverted signal of a logical product of the signal pres_b and the signal lat_rdd(0), becomes a low level. Accordingly, the signal PRES(0) transitions to a low level. When the signal PRES(0) is at the low level, the reset transistor M2 of each of the pixels P(0, 0) to P(m, 0) is set to a non-conductive state, and the FD is held in a floating state. At this time, the amplification transistor M3 and a constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m).

During a period from time t320 to time t321, the control unit 2 controls the column circuit unit 5 to acquire a first N signal and a second N signal in the N-N readout operation. The readout of the first N signal is performed by the same processing as that for the readout of the N signal in the S-N readout. The readout of the second N signal is performed by the same processing as that for the readout of the S signal in the S-N readout. This N-N readout operation corresponds to a first operation in the present disclosure, namely, an operation in which, when the PD of each of the pixels in a corresponding row is in a charge accumulation state, the reset state of the FD is cancelled, and while the PD is maintained in the accumulation state, the amplification transistor M3 performs a plurality of signal outputs.

In addition, at around time t317, the control unit 2 causes the signal rd_latch1_reset to transition to a low level and then to a high level. As a result, the D-FF3212 is reset, and the signal lat_rd(0) is set to a low level.

Subsequently, at time t318, the control unit 2 sets the address signal vaddr to "1". At this time, the address decoder unit 31 sets the decode signal addr(0) to a low level.

At around time t318, the control unit 2 causes the signal rd_latch1_en to transition to a high level and then to a low level. At this time, since the signal lat_rd(0), which is the output signal of the D-FF3212, and the decode signal addr(0) are both at a low level, an output of the OR circuit 3211 becomes a low level. At the timing when the signal rd_latch1_en input to the clock terminal of the D-FF3212 is set to a high level, the D-FF3212 holds the low-level signal that has been input from the OR circuit 3211 to the data input terminal D of the D-FF3212. As a result, "0" is held in the D-FF3212.

In addition, at time t321, the control unit 2 causes the signal pres_b to transition to a low level. The signal PRES(0) transitions to a high level, the reset transistor M2 of each of the pixels P(0, 0) to P(m, 0) is set to a conductive state, and the FD is set to a reset state.

At around time t322, the control unit 2 causes the signals rd_latch2_en and sh_latch2_en to transition to a high level and then to a low level. At the timing when the signal rd_latch2_en input to the clock terminal of the D-FF3213 is set to a high level, the D-FF3213 holds the low-level signal that has been input from the D-FF3212 to the data input terminal D of the D-FF3213. As a result, a signal lat_rdd(0) output from the first memory unit 321 becomes a low level.

In addition, at time t322, the control unit 2 causes the signal fix_en to transition to a high level. Since the signal lat_rdd(0) is at a low level, an output of the AND circuit 3241 becomes a low level. Accordingly, the signal PSEL(0) transitions to a low level. Thus, the selection transistor M4 is set to a non-conductive state, and each of the pixels P(0, 0) to P(m, 0) is set to a non-selected state. Since the signal lat_shd(0) is at a low level and the signal lat_rdd(0) is also at a low level, the transfer signal generation unit 3243 outputs the value of the signal lat_fix(0), that is, a low-level signal. Thus, the signal PTX(0) maintains the low level, and the charge accumulation state of the PD is maintained.

The N-N readout operation on each of the pixels P(0, 0) to P(m, 0) has thus been completed. Subsequently, similar operations are repeated until the address signal vaddr reaches "n", and the N-N readout scanning is then completed.

In FIG. 8, while the N-N readout operation is performed only once, the N-N readout operation may be performed twice or more during the charge accumulation period. In a case where the N-N readout operation is performed more than once, the column offset noise can be more accurately acquired by averaging the differences of the read-out signals.

In addition, while the N-N readout operation is performed during the charge accumulation period after time t313 in FIG. 8, the N-N readout operation may be performed during the charge accumulation period from time t306 to time t311.

[Time t323 to t337]

Next, during a period from time t323 to t337, the S-N readout operation is performed on each of the pixels P(0, 0) to P(m, 0) in the 0-th row. Since this readout operation is the same as that performed during the period from time t212 to t226 in FIG. 7, description thereof will be omitted. The N readout operation in this S-N readout operation corresponds to the operation in which the reset state of the FD is cancelled, and while the PD is maintained in the charge accumulation state, the amplification transistor M3 performs outputting. In addition, the S readout operation in the S-N readout operation corresponds to the operation in which, after the above N readout operation, the transfer transistor M1 transfers charges from the PD to the FD, and subsequently, the amplification transistor M3 performs outputting. Thus, the S-N readout operation performed from time t323 to t337 corresponds to a second operation according to the present disclosure.

In the present driving method, after the S-N readout operation of the previous frame is performed, the electronic shutter operation is performed, and the PD is set to an accumulation state. Next, the N-N readout operation (the first operation) is started while the PD is in the accumulation state. Subsequently, while the accumulation state of the PD is continued, the S-N readout operation (the second operation) is started.

(Driving Method 3: A Case in which an N-N Readout is Performed Outside a Charge Accumulation Period)

Figure 9:
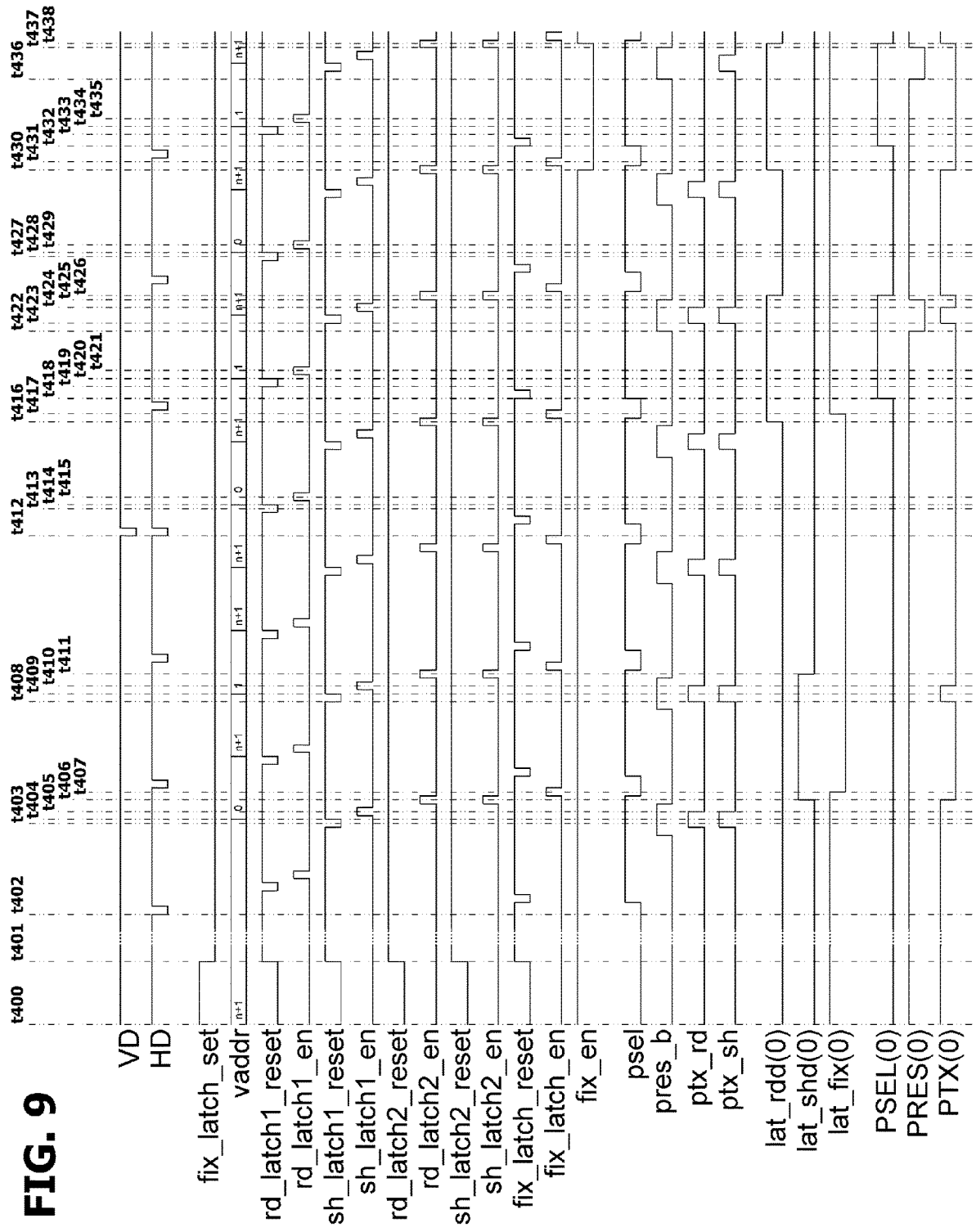
FIG. 9 illustrates a timing chart of a driving method for a case in which an N-N readout operation is performed outside a charge accumulation period according to the first embodiment.

FIG. 9 is a timing chart illustrating a driving method of the vertical scanning unit 3 and the pixel unit 4 according to the first embodiment. In this driving method, an N-N readout operation is performed outside a charge accumulation period. Hereinafter, operations of the vertical scanning unit 3 and the pixel unit 4 will be described with reference to FIGS. 1 to 9. Description of the change in signal level illustrated in FIG. 9 may be omitted if the change is in a portion that is less relevant to the scanning of the pixel unit 4, a portion where the same operation is repeated, or the like.

[Time t400 to t401]

During a period from time t400 to t401, an initialization operation is performed on the vertical scanning unit 3 and the pixel unit 4. Since this initialization operation is the same as that performed in the period from time t200 to t201 in FIG. 7, description thereof will be omitted.

[Time t402 to t411]

Next, during a period from time t402 to t411, an electronic shutter operation is performed on each of the pixels P(0, 0) to P(m, 0) in the 0-th row. Since this electronic shutter operation is the same as that performed in the period from time t202 to t211 in FIG. 7, description thereof will be omitted.

[Time t412 to t426]

Next, during a period from time t412 to t426, a readout operation is performed on each of the pixels P(0, 0) to P(m, 0) in the 0-th row. Since this readout operation is the same as that performed in the period from time t212 to t226 in FIG. 7, description thereof will be omitted.

[Time t427 to t438]

During a period from time t427 to t438, an N-N readout operation is performed on each of the pixels P(0, 0) to P(m, 0) in the 0th row. Each time the horizontal synchronization signal HD is input, the control unit 2 starts control processing for the operation per row, which is the same processing as in the electronic shutter operation.

At around time t427, the control unit 2 causes the signal rd_latch1_reset to transition to a low level and then to a high level. As a result, the D-FF3212 is reset.

At time t428, when the control unit 2 sets the address signal vaddr to "0", the address decoder unit 31 decodes "0" and sets the decode signal addr(0) to a high level.

At around time t429, the control unit 2 causes the signal rd_latch1_en to transition to a high level and then to a low level. At this time, since the signal addr(0) input to the OR circuit 3211 is at a high level, an output of the OR circuit 3211 also becomes a high level. At the timing when the signal rd_latch1_en input to the clock terminal of the D-FF3212 transitions to a high level, the D-FF3212 holds the high-level signal that has been input from the OR circuit 3211 to the data input terminal D of the D-FF3212. As a result, "1" is held in the D-FF3212, and an output signal lat_rd(0) becomes a high level.

At around time t430, the control unit 2 causes the signals rd_latch2_en and sh_latch2_en to transition to a high level and then to a low level. At the timing when the signal rd_latch2_en input to the clock terminal of the D-FF3213 transitions to a high level, the D-FF3213 holds the high-level signal that has been input from the D-FF3212 to the data input terminal D of the D-FF3213. As a result, a signal lat_rdd(0) output from the first memory unit 321 becomes a high level. At this time, since the signal lat_rdd(0) is at a high level and the signal lat_shd(0) is at a low level, the transfer signal generation unit 3243 outputs the value of the signal ptx_rd, that is, a low-level signal. Accordingly, the signal PTX(0) maintains the low level.

In addition, at time t430, the control unit 2 causes the signal fix_en to transition to a low level. In the present embodiment, during the period in which the signal fix_en is at a low level, the control unit 2 performs processing for maintaining the signal ptx_rd at the low level. However, the processing for maintaining the signal ptx_rd at the low level during the period in which the signal fix_en is at the low level is not necessarily performed by the control unit 2. For example, this processing may be performed inside the vertical scanning unit 3.

At around time t431, the control unit 2 causes the signal fix_latch_en to transition to a high level and then to a low level. At this time, the signal lat_rdd(0) is at a high level and the signal lat_shd(0) is at a low level. Therefore, according to the truth table in FIG. 4, a logical sum of fix_en and lat_fix(0) is input to the D-FF3235. At this time, since the lat_fix(0) is "1", the D-FF3235 holds "1", which indicates a reset state, namely, the state A. Thus, a signal lat_fix(0) output from the third memory unit 323 maintains the high level. At this time, however, the signal lat_rdd(0) is at a high level and the signal lat_shd(0) is at a low level. Therefore, according to the truth table in FIG. 5, the signal PTX(0) maintains the value of the signal ptx_rd, that is, a low-level signal.

At time t432, the control unit 2 causes the signal psel to transition to a high level. At this time, since the signal lat_rdd(0) and the signal psel, which are input to the AND circuit 3241, are both at a high level, an output of the AND circuit 3241, which is a logical product of these signals, also becomes a high level. Accordingly, the signal PSEL(0) transitions to a high level. Thus, the selection transistor M4 of each of the pixels P (0, 0) to P (m, 0) in the 0-th row is set to a conductive state, and these pixels are set to a selected state.

At time t436, the control unit 2 causes the signal pres_b to transition to a high level. At this time, since the signal lat_rdd(0) is at a high level, an output of the NAND circuit 3242, which is an inverted signal of a logical product of the signal pres_b and the signal lat_rdd(0), becomes a low level. Accordingly, the signal PRES(0) transitions to a low level. When the signal PRES(0) is at the low level, the reset transistor M2 of each of the pixels P(0, 0) to P(m, 0) is set to a non-conductive state, and the FD is held in a floating state. At this time, the amplification transistor M3 and a constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m).

During a period from time t436 to time t437, the control unit 2 controls the column circuit unit 5 to acquire a first N signal and a second N signal in the N-N readout operation. The readout of the first N signal is performed by the same processing as that for the readout of the N signal in the S-N readout. The readout of the second N signal is performed by the same processing as that for the readout of the S signal in the S-N readout. This N-N readout operation corresponds to a third operation in the present disclosure, namely, an operation in which, when the PD is in a reset state, the reset state of the FD is cancelled, and the amplification transistor M3 performs a plurality of signal outputs.

At time t433, the control unit 2 causes the signal rd_latch1_reset to transition to a low level and then to a high level. As a result, the D-FF3212 is reset, and the signal lat_rd(0) is set to a low level.

Subsequently, at time t434, the control unit 2 sets the address signal vaddr to "1". At this time, the address decoder unit 31 sets the decode signal addr(0) to a low level.

At around time t435, the control unit 2 causes the signal rd_latch1_en to transition to a high level and then to a low level. At this time, since the signal lat_rd(0), which is the output signal of the D-FF3212, and the decode signal addr(0) are both at a low level, an output of the OR circuit 3211 becomes a low level. At the timing when the signal rd_latch1_en input to the clock terminal of the D-FF3212 is set to a high level, the D-FF3212 holds the low-level signal that has been input from the OR circuit 3211 to the data input terminal D of the D-FF3212. As a result, "0" is held in the D-FF3212.

At time t437, the control unit 2 causes the signal pres_b to transition to a low level. The signal PRES(0) transitions to a high level, the reset transistor M2 of each of the pixels P(0, 0) to P(m, 0) is set to a conductive state, and the FD is set to a reset state.

At around time t438, the control unit 2 causes the signals rd_latch2_en and sh_latch2_en to transition to a high level and then to a low level. At the timing when the signal rd_latch2_en input to the clock terminal of the D-FF3213 is set to a high level, the D-FF3213 holds the low-level signal that has been input from the D-FF3212 to the data input terminal D of the D-FF3213. As a result, a signal lat_rdd(0) output from the first memory unit 321 becomes a low level.

At time t438, the control unit 2 causes the signal fix_en to transition to a high level.

Since the signal lat_rdd(0) is at a low level, an output of the AND circuit 3241 becomes a low level. Accordingly, the signal PSEL(0) transitions to a low level. Thus, the selection transistor M4 is set to a non-conductive state, and each of the pixels P(0, 0) to P(m, 0) is set to a non-selected state. Since the signal lat_shd(0) is at a low level and the signal lat_rdd (0) is also at a low level, the transfer signal generation unit 3243 outputs the value of the signal lat_fix(0), that is, a high-level signal. Thus, the signal PTX(0) transitions to a high level, and the PD maintains the reset state again.

The N-N readout operation on each of the pixels P(0, 0) to P(m, 0) has thus been completed. Subsequently, similar operations are repeated until the address signal vaddr reaches "n", and the N-N readout scanning is then completed.

In FIG. 9, while the N-N readout operation is performed only once, the N-N readout operation may be performed twice or more outside the charge accumulation period. In a case where the N-N readout operation is performed more than once, the column offset noise can be more accurately acquired by averaging the differences of the read-out signals.

In addition, in FIG. 9, while the N-N readout operation is performed during the charge non-accumulation period after the S-N readout operation (after time t426), the N-N readout operation may be performed during the charge non-accumulation period before time t406.

(Summary of First Embodiment)

According to the present embodiment, the vertical scanning unit can write a state A "1" in the third memory unit by using an output of the first memory unit and write a state B "0" in the third memory unit by using an output of the second memory unit. Namely, the vertical scanning unit can maintain the PD of the pixel unit 4 in the charge accumulation state in response to the electronic shutter operation and maintain the PD in the reset state in response to the readout operation.

In addition, a logical product of the signal fix_en and the signal lat_rd(0) is obtained by using the AND circuit 3231 and input to the OR circuit 3234 and then to the D-FF3235. In this way, whether to cause the state of the third memory unit to transition to the state A can be selected based on the signal fix_en. Furthermore, when the signal fix_en is at a low level, the signal ptx_rd is set to a low level. By adopting such a configuration, when the signal fix_en is at a low level, if the signal lat_rdd(0) is at a high level, only the PSEL becomes a high level, and the PTX does not become a high level. Thus, irrespective of whether the PD is in the charge accumulation period, the N-N readout can be realized. In addition, when the fix_en is at a high level, if the lat_rdd(0) is at a high level, the PSEL and the PTX become a high level, and the PTX is fixed to the high level. Thus, the normal S-N readout operation can be realized.

In the present embodiment, the difference obtained by subtracting the first N signal from the second N signal, which have been read out in the N-N readout operation, is used as data for generating a correction value. The N-N readout operation can be performed even during image capturing, regardless of a moving image capturing or a still image capturing, so that data for generating a correction value can dynamically be obtained. Therefore, there is no need to store correction values per imaging condition and per mode. Thus, the memory capacity can be reduced. The generated correction value is applicable to a desired correction as long as the correction is caused by the readout circuit, such as an offset correction.

Embodiment 2

Next, an imaging apparatus (photoelectric conversion apparatus) according to a second embodiment of the present invention will be described with focus on the difference between the first embodiment and the second embodiment. In the present embodiment, the imaging apparatus can also perform an N-N readout operation both in a charge accumulation period and a charge non-accumulation period of a photoelectric conversion element, which is the same function as in the first embodiment. However, the imaging apparatus of the present embodiment differs from that of the first embodiment in that the configuration of a vertical scanning unit for realizing this function is different from that in the first embodiment.

(Vertical Scanning Unit 3a)

Figure 10:
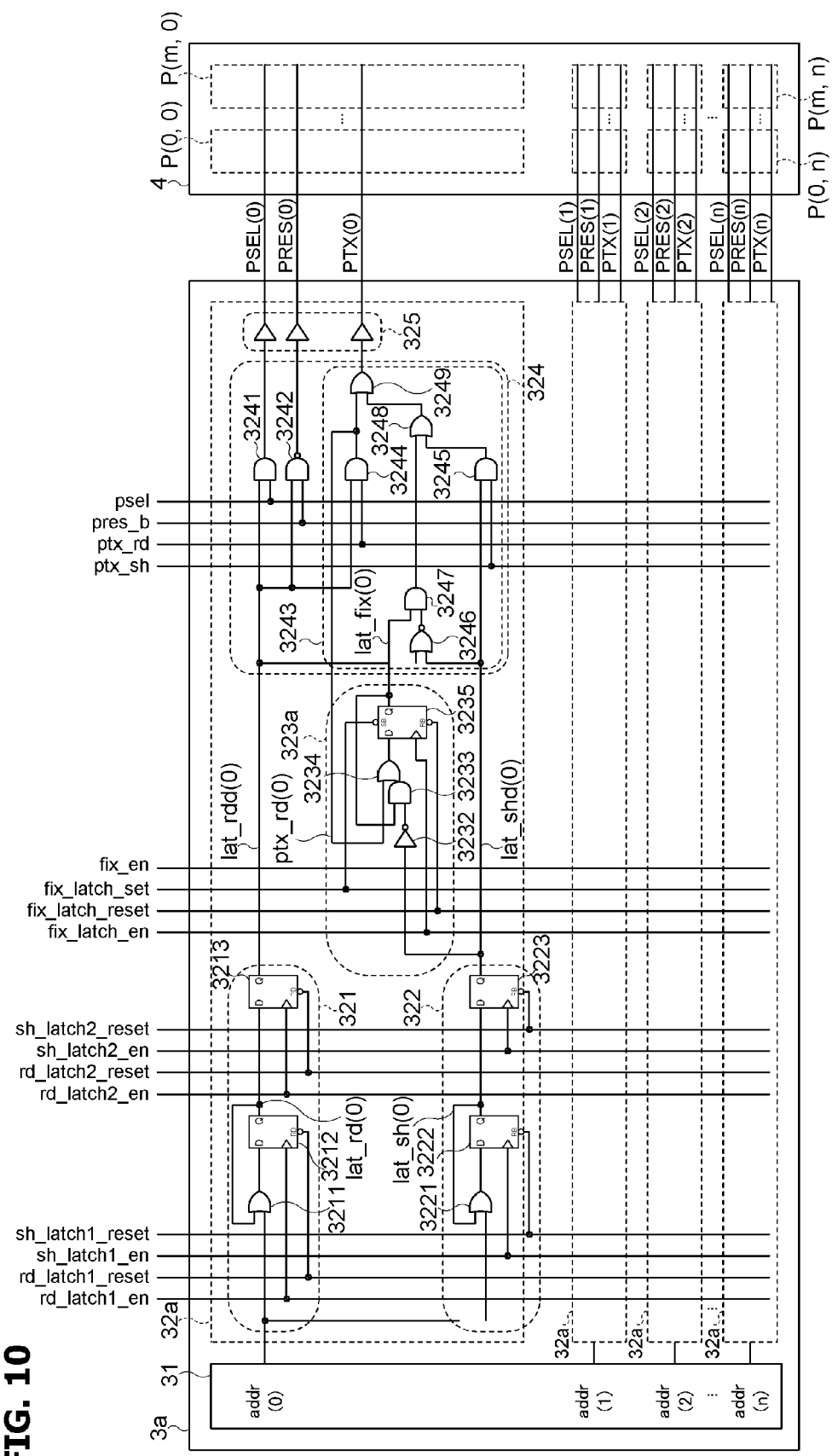
FIG. 10 illustrates a configuration of a vertical scanning unit according to a second embodiment.

FIG. 10 illustrates a configuration of a vertical scanning unit 3a according to the second embodiment. In the present embodiment, a third memory unit 323a that corresponds to the third memory unit 323 of the first embodiment does not include an AND circuit 3231. Instead, an output signal of an AND circuit 3244 in a transfer signal generation unit 3243 is input to the third memory unit 323a. Hereinafter, the output signal of the AND circuit 3244 is referred to as a signal ptx_rd(x). In FIG. 10, the portion that corresponds to the first embodiment is denoted by adding a to each of the equivalent reference characters in FIG. 3. Matters not mentioned in the description of the present embodiment are deemed to be the same as the first embodiment.

According to the present embodiment, since the third memory unit 323a does not include an AND circuit 3231, the circuit scale can be reduced compared with the first embodiment.

[Third Storage unit 323a]

A signal ptx_rd(x) input to the third memory unit 323a is then input to one terminal of an OR circuit 3234. An output signal of an AND circuit 3233 is input to the other terminal of the OR circuit 3234. Thus, a logical sum of the signal ptx_rd(x) and the output signal of the AND circuit 3233 is output from the OR circuit 3234 and input to an input terminal D of D-FF3235.

FIG. 11 illustrates a truth table of input values to the D-FF3235 according to the second embodiment. This truth table indicates output values with respect to the values of signals lat_rdd(x) and lat_shd(x).

If the signal lat_rdd(x) is "1" and the signal lat_shd(x) is "1", the signal ptx_rd is input to the D-FF3235. If the signal lat_rdd(x) is "1" and the signal lat_shd(x) is "0", a logical sum of the signal ptx_rd and the signal lat_fix(x) is input.

If the signal lat_rdd(x) is "0" and the signal lat_shd(x) is "1", "0" is input to the D-FF3235. If the signal lat_rdd(x) is "0" and the signal lat_shd(x) is "0", the signal lat_fix(x) is input.

When the output signal lat_rdd(x) of the first memory unit 321 is at a high level, if the signal ptx_rd is at a high level, the third memory unit 323a can hold "1", which is a state A. Namely, whether to cause the state of the third memory unit 323a to transition to the state A can be selected based on the signal ptx_rd. When the third memory unit 323a holds "1" as the state A, if the output signal lat_shd(x) of the second memory unit 322 is at a low level, the third memory unit 323a continues to hold the state A. In addition, if the output signal lat_shd(x) of the second memory unit 322 is at a high level, the third memory unit 323a can hold "0", which is a state B.

The state of the third memory unit 323a is regarded to be controlled by combination logic circuits including the NOT circuit 3232, the AND circuit 3233, the OR circuit 3234, and the AND circuit 3244. The combination logic circuits including the NOT circuit 3232, the AND circuit 3233, the OR circuit 3234, and the AND circuit 3244 correspond to a selection unit that selects whether to cause the state of the signal held in the D-FF3235 to transition. When the signal lat_rdd(0) for instructing the readout is input, the selection unit selects whether to cause the state of the third memory unit 323a to transition, based on the level of the signal ptx_rd. Specifically, if the signal ptx_rd is at a high level, the selection unit transmits the signal lat_rdd(0) to the D-FF3235 via the AND circuit 3244. As a result, the state of the D-FF3235 transitions to the state A, namely, the state in which the D-FF3235 holds "1", which is a signal for setting the pixels to the reset state. In addition, when the signal lat_shd(0) for instructing the shutter operation is input, the selection unit causes the D-FF3235 to transition to the state B, which is the state in which the D-FF3235 holds "0".

(Driving Method)

Figure 12:
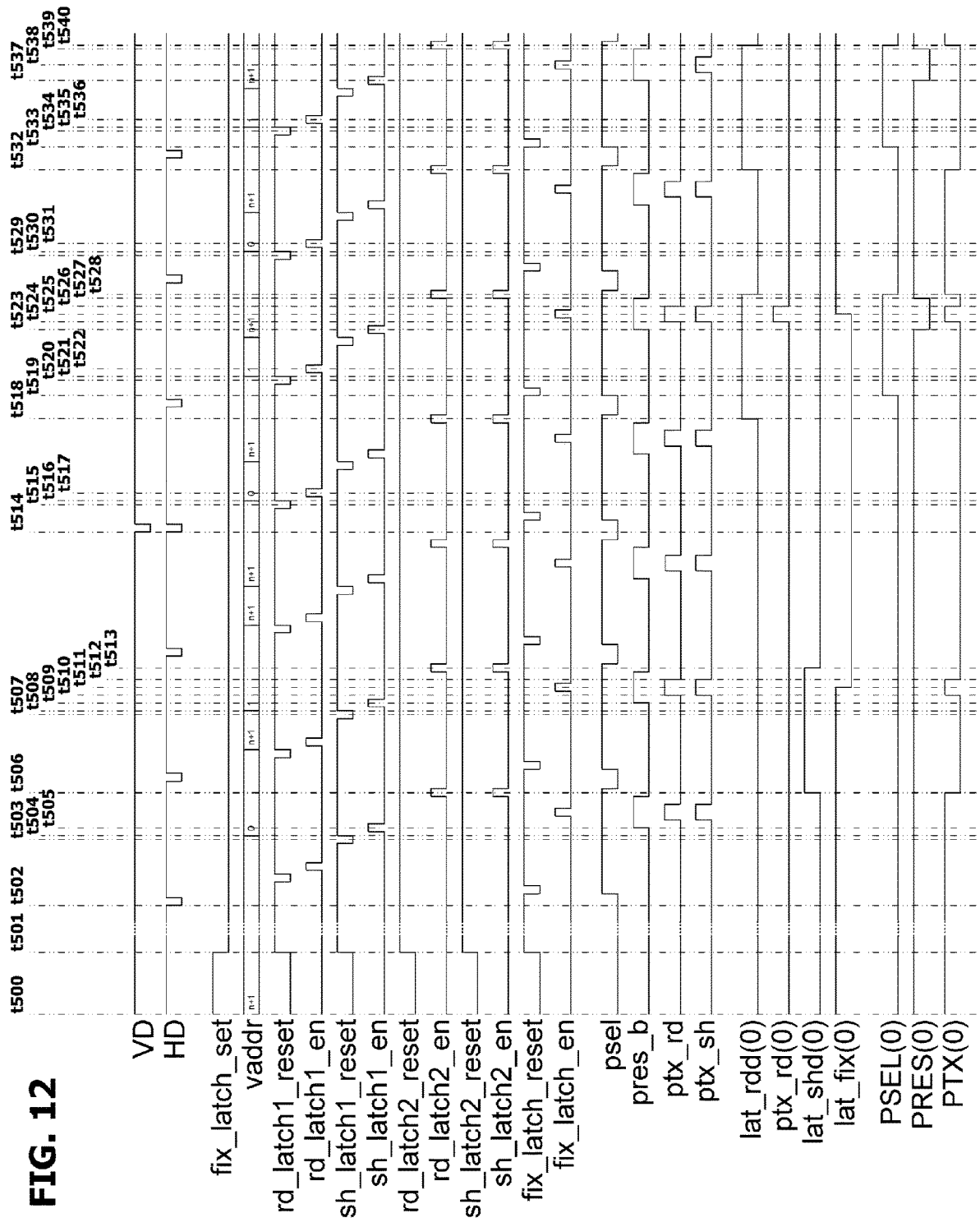
FIG. 12 illustrates a timing chart of a driving method for a case in which an N-N readout operation is performed outside a charge accumulation period according to the second embodiment.

FIG. 12 is a timing chart illustrating a driving method of a vertical scanning unit 3 and a pixel unit 4 according to the second embodiment. In this driving method, an N-N readout operation is performed outside the charge accumulation period.

Herein, only a driving method in which the N-N readout operation is performed outside the charge accumulation period will be described. However, as in the first embodiment, a driving method in which an N-N readout operation is performed during the charge accumulation period and a driving method in which the N-N readout operation is not performed can also be realized.

Hereinafter, operations of the vertical scanning unit 3 and the pixel unit 4 will be described with reference to FIGS. 1 to 11. Description of the change in signal level illustrated in FIG. 9 may be omitted if the change is in a portion that is less relevant to the scanning of the pixel unit 4, a portion where the same operation is repeated, or the like.

[Time t500 to t501]

During a period from time t500 to t501, an initialization operation is performed on the vertical scanning unit 3a and the pixel unit 4. In this initialization operation, based on a signal fix_latch_set input to the third memory unit 323a, the FDs in all the rows are reset. Since this initialization operation is the same as that performed in the period from time t200 to t201 in FIG. 7 (the first embodiment), description thereof will be omitted.

[Time t502 to t513]

Next, during a period from time t502 to t513, an electronic shutter operation is performed on each of the pixels P(0, 0) to P(m, 0) in the 0-th row. This electronic shutter operation is the same as that performed in the period from time t202 to t211 in FIG. 7 (the first embodiment), description thereof will be omitted.

[Time t514 to t527]

Next, during a period from time t514 to t527, a readout operation is performed on each of the pixels P(0, 0) to P(m, 0) in the 0-th row.

At time t514, when a low-level pulse of a vertical synchronization signal VD is input to the control unit 2, the control unit 2 starts control processing for a readout operation. Each time the horizontal synchronization signal HD is input, the control unit 2 starts control processing for the operation per row, which is the same processing as in the electronic shutter operation.

At around time t515, the control unit 2 causes the signal rd_latch1_reset to transition to a low level and then to a high level. As a result, the D-FF3212 is reset.

At time t516, when the control unit 2 sets an address signal vaddr to "0", an address decoder unit 31 decodes "0" and sets a decode signal addr(0) to a high level.

At around time t517, the control unit 2 causes the signal rd_latch1_en to transition to a high level and then to a low level. At this time, since the signal addr(0) input to the OR circuit 3211 is at a high level, an output of the OR circuit 3211 also becomes a high level. At the timing when the signal rd_latch1_en input to the clock terminal of the D-FF3212 transitions to a high level, the D-FF3212 holds the high-level signal that has been input from the OR circuit 3211 to the data input terminal D of the D-FF3212. As a result, "1" is held in the D-FF3212, and an output signal lat_rd(0) becomes a high level.

At around time t518, the control unit 2 causes the signals rd_latch2_en and sh_latch2_en to transition to a high level and then to a low level. At the timing when the signal rd_latch2_en input to the clock terminal of the D-FF3213 transitions to a high level, the D-FF3213 holds the high-level signal that has been input from the D-FF3212 to the data input terminal D of the D-FF3213. As a result, a signal lat_rdd(0) output from the first memory unit 321 becomes a high level. At this time, since the signal lat_rdd(0) is at a high level and the signal lat_shd(0) is at a low level, the transfer signal generation unit 3243 outputs the value of the signal ptx_rd, that is, a low-level signal. Accordingly, the signal PTX(0) maintains the low level.

At around time t525, the control unit 2 causes the signal fix_latch_en to transition to a high level and then to a low level. At this time, the signal lat_rdd(0) is at a high level and the signal lat_shd(0) is at a low level. Therefore, according to the truth table in FIG. 11, a logical sum of ptx_rd and lat_fix(0) is input to the D-FF3235. At this time, since the ptx_rd is "1", the D-FF3235 holds "1", which indicates a reset state, namely, the state A. Thus, a signal lat_fix(0) output from the third memory unit 323a becomes a high level. At this time, however, the signal lat_rdd(0) is at a high level and the signal lat_shd(0) is at a low level. Therefore, according to the truth table in FIG. 5, the signal PTX(0) outputs the value of the signal ptx_rd.

At time t519, the control unit 2 causes the signal psel to transition to a high level. At this time, since the signal lat_rdd(0) and the signal psel, which are input to the AND circuit 3241, are both at a high level, an output of the AND circuit 3241, which is a logical product of these signals, also becomes a high level. Accordingly, the signal PSEL(0) transitions to a high level. Thus, the selection transistor M4 of each of the pixels P (0, 0) to P (m, 0) in the 0-th row is set to a conductive state, and these pixels are set to a selected state.

At time t523, the control unit 2 causes the signal pres_b to transition to a high level. At this time, since the signal lat_rdd(0) is at a high level, an output of the NAND circuit 3242, which is an inverted signal of a logical product of the signal pres_b and the signal lat_rdd(0), becomes a low level. Accordingly, the signal PRES(0) transitions to a low level. When the signal PRES(0) is at the low level, the reset transistor M2 of each of the pixels P(0, 0) to P(m, 0) is set to a non-conductive state, and the FD is held in a floating state. At this time, the amplification transistor M3 and a constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m). The control unit 2 controls the column circuit unit 5 to read out the noise signal that has appeared on the vertical output lines Vline(0) to Vline(m).

At time t524, the control unit 2 causes the signals ptx_rd and ptx_sh to transition to a high level. Since the signal lat_rdd(0) is at a high level and the signal lat_shd(0) is at a low level, and in view of the fact that the signal PTX(0) matches the value of the signal ptx_rd, the signal PTX(0) transitions to a high level. As a result, the transfer transistor M1 of each of the pixels P(0, 0) to P(m, 0) is set to a conductive state, and charges generated and accumulated in the PD are transferred to the FD.

Next, at time t526, the control unit 2 causes the values of the signals ptx_rd and ptx_sh to transition to a low level. Accordingly, the signal PTX(0) transitions to a low level again. As a result, the transfer transistor M1 of each of the pixels P(0, 0) to P(m, 0) is set to a non-conductive state. This terminates the transfer of the charges accumulated in the PD to the FD. Subsequently, the amplification transistor M3 and the constant current source (not illustrated) operate as a source follower, and a pixel signal (S signal) corresponding to the charge held in the FD is output to the vertical output lines Vline(0) to Vline(m). The control unit 2 controls the column circuit unit 5 to read out the pixel signal that has appeared on the vertical output lines Vline(0) to Vline(m).

In addition, at time t520, the control unit 2 causes the signal rd_latch1_reset to transition to a low level and then to a high level. As a result, the D-FF3212 is reset, and the signal lat_rd(0) is set to a low level.

Subsequently, at time t521, the control unit 2 sets the address signal vaddr to "1". At this time, the address decoder unit 31 sets the decode signal addr(0) to a low level.

At around time t522, the control unit 2 causes the signal rd_latch1_en to transition to a high level and then to a low level. At this time, since the signal lat_rd(0), which is the output signal of the D-FF3212, and the decode signal addr(0) are both at a low level, an output of the OR circuit 3211 becomes a low level. At the timing when the signal rd_latch1_en input to the clock terminal of the D-FF3212 is set to a high level, the D-FF3212 holds the low-level signal that has been input from the OR circuit 3211 to the data input terminal D of the D-FF3212. As a result, "0" is held in the D-FF3212.

Furthermore, at time t527, the control unit 2 causes the signal pres_b to transition to a low level. The signal PRES(0) transitions to a high level, the reset transistor M2 of each of the pixels P(0, 0) to P(m, 0) is set to a conductive state, and the FD is set to a reset state.

At around time t528, the control unit 2 causes the signals rd_latch2_en and sh_latch2_en to transition to a high level and then to a low level. At the timing when the signal rd_latch2_en input to the clock terminal of the D-FF3213 is set to a high level, the D-FF3213 holds the low-level signal that has been input from the D-FF3212 to the data input terminal D of the D-FF3213. As a result, a signal lat_rdd(0) output from the first memory unit 321 becomes a low level.

Since the signal lat_rdd(0) is at a low level, an output of the AND circuit 3241 becomes a low level. Accordingly, the signal PSEL(0) transitions to a low level. Thus, the selection transistor M4 is set to a non-conductive state, and each of the pixels P(0, 0) to P(m, 0) is set to a non-selected state. Since the signal lat_shd(0) is at a low level and the signal lat_rdd (0) is also at a low level, the transfer signal generation unit 3243 outputs the value of the signal lat_fix(0), that is, a high-level signal. Thus, the signal PTX(0) becomes a high level, the transfer transistor M1 of each of the pixels P(0, 0) to P(m, 0) is set to a conductive state, and the PD maintains the reset state again.

[Time t529 to t540]

During a period from time t529 to t540, an N-N readout operation is performed on each of the pixels P(0, 0) to P(m, 0) in the 0-th row. Each time the horizontal synchronization signal HD is input, the control unit 2 starts control processing for the operation per row, which is the same processing as in the electronic shutter operation.

At around time t529, the control unit 2 causes the signal rd_latch1_reset to transition to a low level and then to a high level. As a result, the D-FF3212 is reset.

At time t530, when the control unit 2 sets the address signal vaddr to "0", the address decoder unit 31 decodes "0" and sets the decode signal addr(0) to a high level.

At around time t531, the control unit 2 causes the signal rd_latch1_en to transition to a high level and then to a low level. At this time, since the signal addr(0) input to the OR circuit 3211 is at a high level, an output of the OR circuit 3211 also becomes a high level. At the timing when the signal rd_latch1_en input to the clock terminal of the D-FF3212 transitions to a high level, the D-FF3212 holds the high-level signal that has been input from the OR circuit 3211 to the data input terminal D of the D-FF3212. As a result, "1" is held in the D-FF3212, and an output signal lat_rd(0) becomes a high level.

At around time t532, the control unit 2 causes the signals rd_latch2_en and sh_latch2_en to transition to a high level and then to a low level. At the timing when the signal rd_latch2_en input to the clock terminal of the D-FF3213 transitions to a high level, the D-FF3213 holds the high-level signal that has been input from the D-FF3212 to the data input terminal D of the D-FF3213. As a result, a signal lat_rdd(0) output from the first memory unit 321 becomes a high level. At this time, since the signal lat_rdd(0) is at a high level and the signal lat_shd(0) is at a low level, the transfer signal generation unit 3243 outputs the value of the signal ptx_rd, that is, a low-level signal. Accordingly, the signal PTX(0) maintains the low level.

In the present embodiment, during the period in which the N-N readout operation is performed, the control unit 2 performs processing for maintaining the signal ptx_rd at the low level. However, the processing for maintaining the signal ptx_rd at the low level during the period in which the signal fix_en is at the low level is not necessarily performed by the control unit 2. For example, this processing may be performed inside the vertical scanning unit 3*a*.

At around time t538, the control unit 2 causes the signal fix_latch_en to transition to a high level and then to a low level. At this time, the signal lat_rdd(0) is at a high level and the signal lat_shd(0) is at a low level. Therefore, according to the truth table in FIG. 11, a logical sum of ptx_rd and lat_fix(0) is input to the D-FF3235. At this time, since the lat_fix(0) is "1", the D-FF3235 holds "1", which indicates a reset state, namely, the state A. Thus, a signal lat_fix(0) output from the third memory unit 323*a* maintains the high level. At this time, however, the signal lat_rdd(0) is at a high level and the signal lat_shd(0) is at a low level. Therefore, according to the truth table in FIG. 5, the signal PTX(0) maintains the value of the signal ptx_rd, that is, a low-level signal.

At time t533, the control unit 2 causes the signal psel to transition to a high level. At this time, since the signal lat_rdd(0) and the signal psel, which are input to the AND circuit 3241, are both at a high level, an output of the AND circuit 3241, which is a logical product of these signals, also becomes a high level. Accordingly, the signal PSEL(0) transitions to a high level. Thus, the selection transistor M4 of each of the pixels P (0, 0) to P (m, 0) in the 0-th row is set to a conductive state, and these pixels are set to a selected state.

At time t537, the control unit 2 causes the signal pres_b to transition to a high level. At this time, since the signal lat_rdd(0) is at a high level, an output of the NAND circuit 3242, which is an inverted signal of a logical product of the signal pres_b and the signal lat_rdd(0), becomes a low level. Accordingly, the signal PRES(0) transitions to a low level. When the signal PRES(0) is at the low level, the reset transistor M2 of each of the pixels P(0, 0) to P(m, 0) is set to a non-conductive state, and the FD is held in a floating state. At this time, the amplification transistor M3 and the constant current source (not illustrated) operate as a source follower. Since charges accumulated in the PD have not yet been transferred to the FD, a noise signal (N signal) caused by the FD and the amplification transistor M3 appears on the vertical output lines Vline(0) to Vline(m). During a period from time t537 to time t539, the control unit 2 controls the column circuit unit 5 to acquire a first N signal and a second N signal in the N-N readout operation. The readout of the first N signal is performed by the same processing as that for the readout of the N signal in the S-N readout. The readout of the second N signal is performed by the same processing as that for the readout of the S signal in the S-N readout.

In addition, at around time t534, the control unit 2 causes the signal rd_latch1_reset to transition to a low level and then a high level. As a result, the D-FF3212 is reset, and the signal lat_rd(0) is set to a low level.

Subsequently, at time t535, the control unit 2 sets the address signal vaddr to "1". At this time, the address decoder unit 31 sets the decode signal addr(0) to a low level.

At around time t536, the control unit 2 causes the signal rd_latch1_en to transition to a high level and then to a low level. At this time, since the signal lat_rd(0), which is the output signal of the D-FF3212, and the decode signal addr(0) are both at a low level, an output of the OR circuit 3211 becomes a low level. At the timing when the signal rd_latch1_en input to the clock terminal of the D-FF3212 is set to a high level, the D-FF3212 holds the low-level signal that has been input from the OR circuit 3211 to the data input terminal D of the D-FF3212. As a result, "0" is held in the D-FF3212.

Further, at time t539, the control unit 2 causes the signal pres_b to transition to a low level. The signal PRES(0) transitions to a high level, the reset transistor M2 of each of the pixels P(0, 0) to P(m, 0) is set to a conductive state, and the FD is set to a reset state.

At around time t540, the control unit 2 causes the signals rd_latch2_en and sh_latch2_en to transition to a high level and then to a low level. At the timing when the signal rd_latch2_en input to the clock terminal of the D-FF3213 is set to a high level, the D-FF3213 holds the low-level signal that has been input from the D-FF3212 to the data input terminal D of the D-FF3213. As a result, a signal lat_rdd(0) output from the first memory unit 321 becomes a low level.

Since the signal lat_rdd(0) is at a low level, an output of the AND circuit 3241 becomes a low level. Accordingly, the signal PSEL(0) transitions to a low level. Thus, the selection transistor M4 is set to a non-conductive state, and each of the pixels P(0, 0) to P(m, 0) is set to a non-selected state. Since the signal lat_shd(0) is at a low level and the signal lat_rdd (0) is also at a low level, the transfer signal generation unit 3243 outputs the value of the signal lat_fix(0), that is, a high-level signal. Thus, the signal PTX(0) transitions to a high level, and the PD maintains the reset state again.

The N-N readout operation on each of the pixels P(0, 0) to P(m, 0) has thus been completed. Subsequently, similar operations are repeated until the address signal vaddr reaches "n", and the N-N readout scanning is then completed.

In FIG. 12, while the N-N readout operation is performed only once, the N-N readout operation may be performed twice or more outside the charge accumulation period. In a case where the N-N readout operation is performed more than once, the column offset noise can be more accurately acquired by averaging the differences of the read-out signals.

In addition, in the present embodiment, while a driving method in which the N-N readout operation is performed during the charge accumulation period and a driving method in which the N-N readout operation is not performed can also be realized, description thereof will be omitted.

(Summary of Second Embodiment)

In the present embodiment, the third memory unit 323*a* that corresponds to the third memory unit 323 in the first embodiment does not include an AND circuit 3231. According to the present embodiment, since the third memory unit 323*a* does not include the AND circuit 3231, the circuit scale can be reduced compared with the first embodiment.

In the present embodiment, by using the circuit scale smaller than that of the first embodiment, the N-N readout can be performed both in the charge accumulation period and outside the charge accumulation period, as in the first embodiment.

Embodiment 3

Figure 13:
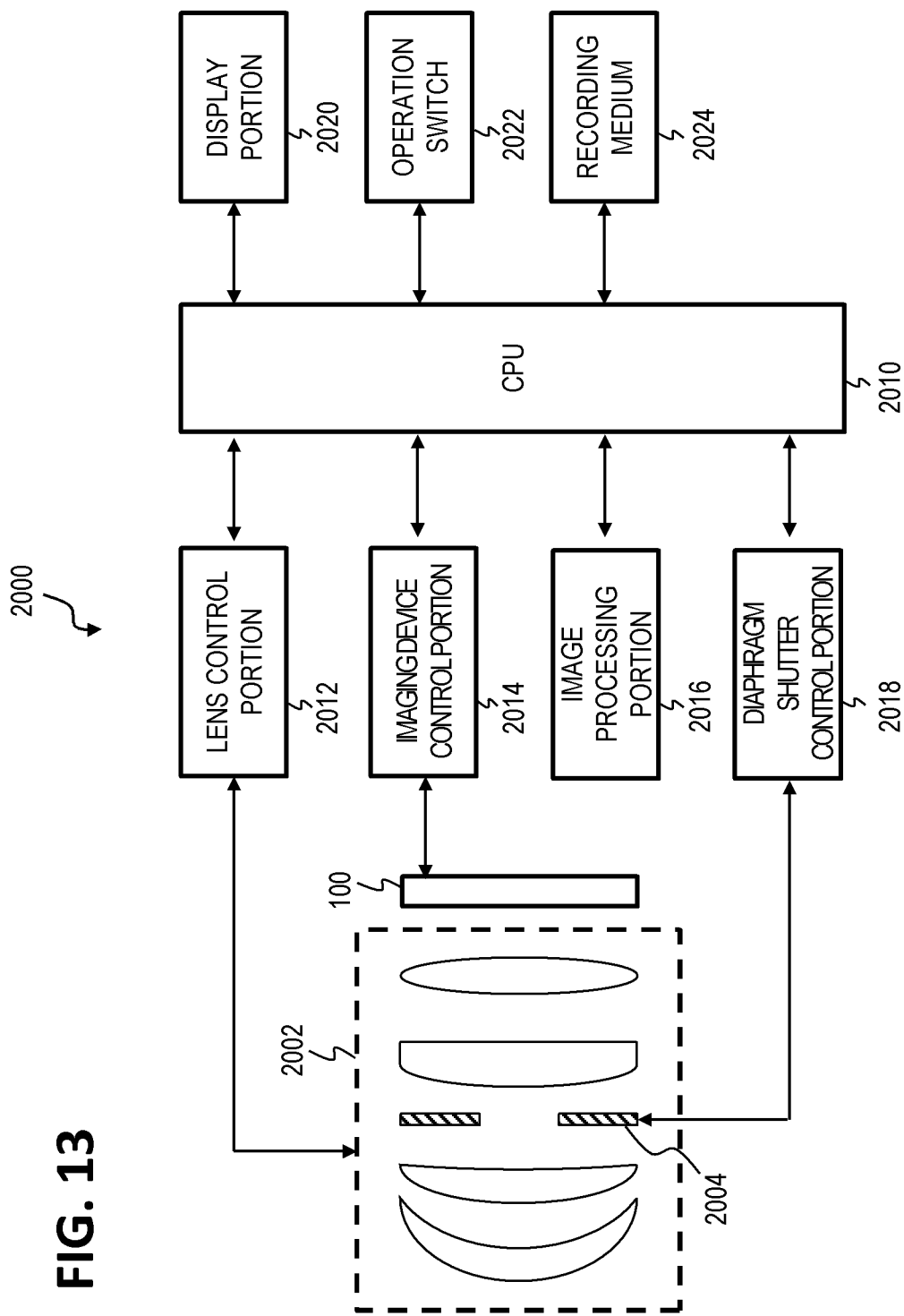
FIG. 13 illustrates a configuration of an imaging system according to a third embodiment.

An imaging system according to a third embodiment of the present invention will be explained with reference to FIG. 13. FIG. 13 is a block diagram of a schematic configuration of an imaging system according to this embodiment.

The solid-state imaging devices (photoelectric conversion devices) described in the above first and second embodiments may apply to various imaging systems. Applicable imaging systems may include, but are not limited to, various types of equipment such as a digital still camera, a digital camcorder, a monitor camera, a copying machine, a facsimile, a mobile phone, an in-vehicle camera, an observation satellite, a medical camera, or the like. The imaging systems may also include a camera module including an optical system such as a lens and a solid-state imaging device (photoelectric conversion device). FIG. 13 is a block diagram of a digital still camera as an example of those imaging systems.

FIG. 13 shows an imaging system 2000, which includes an imaging device 100, an imaging optical system 2002, a CPU 2010, a lens control portion 2012, an imaging device control portion 2014, an image processing portion 2016, and a diaphragm shutter control portion 2018. The imaging system 2000 also includes a display portion 2020, an operation switch 2022, and a recording medium 2024.

The imaging optical system 2002 is an optical system for forming an optical image of the subject, and includes a lens group, a diaphragm 2004, or the like. The diaphragm 2004 has a function of adjusting light intensity during photography by adjusting its opening size. The diaphragm 2004 also functions as an exposure time adjustment shutter during still image photography. The lens group and the diaphragm 2004 are held movable forward and backward in the optical axis direction. These linked operations may provide a scaling function (zoom function) and a focus adjustment function. The imaging optical system 2002 may be integrated into the imaging system or may be an imaging lens mountable to the imaging system.

The imaging device 100 is disposed such that its imaging plane is positioned in the image space of the imaging optical system 2002. The imaging device 100 is one of the solid-state imaging devices (photoelectric conversion devices) explained in the first and second embodiments. The imaging device 100 includes a CMOS sensor (pixel portion) and its peripheral circuits (peripheral circuit area). The imaging device 100 includes a plurality of pixels arranged in two dimensions, each pixel including a photoelectric conversion portion. These pixels are provided with color filters to form a two-dimensional single-plate color sensor. The imaging device 100 may photoelectrically convert a subject image imaged by the imaging optical system 2002 for output as an image signal and/or a focus detection signal.

The lens control portion 2012 is to control the forward and backward driving of the lens group in the imaging optical system 2002 to perform scaling operation and focus adjustment. The lens control portion 2012 includes a circuit and/or processing unit configured to achieve those functions. The diaphragm shutter control portion 2018 is to change the opening size of the diaphragm 2004 (for a variable diaphragm value) to adjust light intensity during photography, and is constituted of a circuit and/or processing unit configured to achieve those functions.

The CPU 2010 is a control unit in a camera responsible for various controls of the camera bod, and includes an operation portion, a ROM, a RAM, an A/D converter, a D/A converter, a communication interface circuit, or the like. The CPU 2010 controls the operation of each portion in the camera according to a computer program stored in a ROM or the like. The CPU 2010 performs a series of photography operations such as AF, imaging, image processing, and recording, including detection of the focus state (focus detection) of the imaging optical system 2002. The CPU 2010 also serves as a signal processing portion.

The imaging device control portion 2014 is to control the operation of the imaging device 100 and to A/D convert a signal output from the imaging device 100 and transmit the result to the CPU 2010, and includes a circuit and/or control unit configured to achieve those functions. The imaging device 100 may have the A/D conversion function. The image processing portion 2016 is a processing unit that subjects the A/D converted signal to processing such as y conversion and color interpolation to generate an image signal. The image processing portion 2016 includes a circuit and/or control unit configured to achieve those functions. The display portion 2020 is a display device such as a liquid crystal display device (LCD), and displays information related to a photography mode of the camera, a preview image before photography, a check image after photography, the focused state at the focus detection, or the like. The operation switch 2022 includes a power supply switch, a release (photography trigger) switch, a zoom operation switch, a photography mode selection switch, or the like. The recording medium 2024 is to record a photographed image or the like, and may be built in the imaging system or removable such as a memory card.

In this way, the imaging system 2000 applied with the imaging device 100 according to the first and second embodiments may provide a high performance imaging system.

Embodiment 4

Figure 14A:
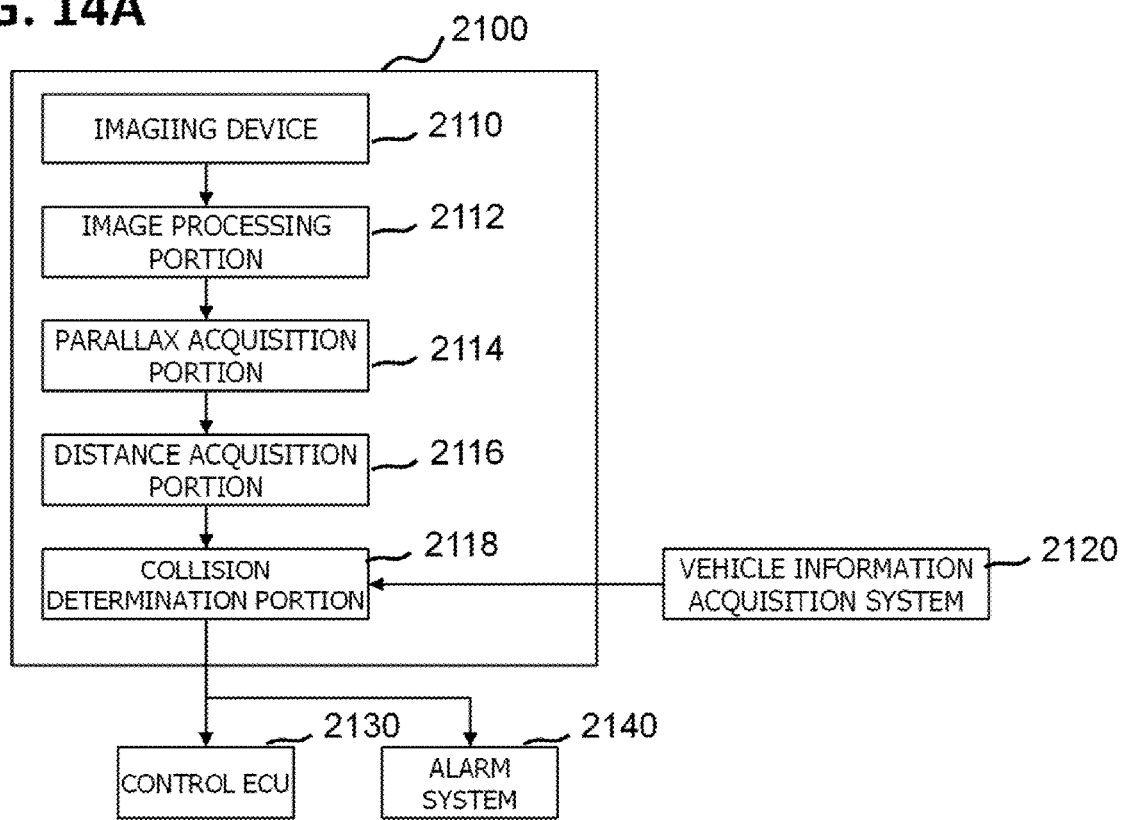
FIGS. 14A and 14B illustrate a configuration of an imaging system and a mobile body according to a fourth embodiment.
Figure 14B:
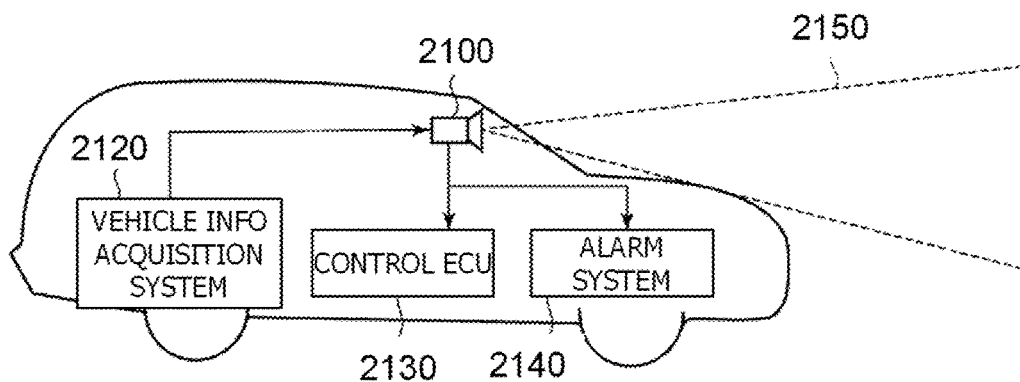

An imaging system and a mobile object according to a fourth embodiment of the present invention will be explained with reference to FIGS. 14A and 14B. FIGS. 14A and 14B show configurations of the imaging system and mobile object according to this embodiment.

FIG. 14A shows an example of an imaging system 2100 associated with an in-vehicle camera. The imaging system 2100 has an imaging device 2110. The imaging device 2110 is any one of the solid-state imaging devices (photoelectric conversion devices) according to the above first to third embodiments. The imaging system 2100 has an image processing portion 2112 and a parallax acquisition portion 2114. The image processing portion 2112 is a processing unit that subjects a plurality of sets of image data acquired by the imaging device 2110 to image processing. The parallax acquisition portion 2114 is a processing unit that calculates parallax (a phase difference of a parallax image) from the sets of image data acquired by the imaging device 2110. The imaging system 2100 also includes a distance acquisition portion 2116, which is a processing unit that calculates the distance to the subject based on the calculated parallax. The imaging system 2100 also includes a collision determination portion 2118, which is a processing unit that determines a possibility of collision based on the calculated distance. Here, the parallax acquisition portion 2114 and the distance acquisition portion 2116 are examples of information acquiring means that acquires information such as distance information to the subject. In other words, the distance information is information related to parallax, defocus amount, the distance to the subject, or the like. The collision determination portion 2118 may determine a possibility of collision using any of the distance information. The above processing unit may be provided by specially designed hardware or may be provided by general hardware that performs operation based on a software module. In addition, the processing unit may be provided by a Field Programmable Gate Array (FPGA), an Application Specific Integrated Circuit (ASIC), or the like or may be provided by a combination thereof.

The imaging system 2100 is connected to a vehicle information acquisition system 2120, and may thus acquire vehicle information including a vehicle speed, a yaw rate, and a rudder angle. The imaging system 2100 also has a control ECU 2130 connected thereto. The ECU 2130 is a control unit that outputs a control signal for generating a braking force to the vehicle based on the determination by the collision determination portion 2118. In other words, the control ECU 2130 is an example of a mobile object control means that controls a mobile object based on the distance information. The imaging system 2100 is also connected to an alarm system 2140. The alarm system 2140 gives an alarm to the driver based on the determination by the collision determination portion 2118. For example, if the collision determination portion 2118 determines a high possibility of collision, the control ECU 2130 performs a vehicle control that avoids collision and reduces damage by braking, releasing the accelerator, limiting the engine output, or the like. The alarm system 2140 warns the user by sounding an alarm such as sound, displaying alarm information on a screen of a car navigation system or the like, giving vibration to a seatbelt and steering, or the like.

In this embodiment, the surroundings of the vehicle such as front or rear are imaged by the imaging system 2100. FIG. 14B shows the imaging system 2100 when imaging the front of the vehicle (imaging range 2150). The vehicle information acquisition system 2120 directs the imaging system 2100 to operate and perform imaging. Using the imaging devices according to the above first to third embodiments as the imaging device 2110, the imaging system 2100 in this embodiment may provide more improved ranging accuracy.

Although the above description shows an example control that prevents collision with other vehicles, the present invention may also apply to a control of autonomous driving following other vehicles, a control of autonomous driving preventing running over a traffic lane, or the like. In addition to a vehicle such as a car, the imaging system may also apply to, for example, a mobile object (transportation equipment) such as a vessel, an aircraft, or an industrial robot. The moving device in the mobile object (transportation equipment) is one of various types of drive sources, including an engine, a motor, a wheel, and a propeller. In addition to a mobile object, the imaging system may also apply to equipment, such as Intelligent Transport Systems (ITS), that commonly uses the object recognition.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-148886, filed on Aug. 14, 2019, which is hereby incorporated by reference herein in its entirety.

What is claimed is:

1. A driving apparatus that outputs a drive signal for driving, per row, a plurality of pixels arranged to form a plurality of rows,
the driving apparatus comprising a plurality of row driving units arranged to correspond to the respective rows, wherein each of the row driving units includes:
a memory unit that holds a signal for controlling the pixels in a corresponding row to be set to a charge accumulation state or a reset state; and
a selection unit that selects whether to cause a state of the signal held in the memory unit to transition in a case where a signal for readout from the pixels is input.

2. The driving apparatus according to claim 1, wherein, in a case where the signal for readout is input, the selection unit selects whether to cause the state of the signal held in the memory unit to transition, in accordance with a level of a signal for allowing the memory unit to be updated, the signal being input from a control circuit.

3. The driving apparatus according to claim 1, wherein, in a case where the signal for readout is input, the selection unit selects whether to cause the state of the signal held in the memory unit to transition, based on a level of a signal for transferring charges in the pixels, the signal being input from a control circuit.

4. The driving apparatus according to claim 3,
wherein each of the plurality of pixels includes:
a charge accumulation unit that accumulates charges;
an output unit that includes an input node that receives the charges and performs an output based on a potential of the input node;
a charge transfer unit that transfers the charges from the charge accumulation unit to the input node; and
a reset unit that resets the charge accumulation unit or the input node, and
wherein the charge transfer unit operates based on the signal for transferring charges.

5. The driving apparatus according to claim 2,
wherein the selection unit controls whether to transmit the signal for readout to the memory unit in accordance with a signal based on a logical operation between the signal for readout and a signal input from the control circuit, and
wherein in a case where the signal for readout is transmitted from the selection unit to the memory unit, the state of the signal held in the memory unit is transitioned from a signal for controlling the pixels to be set to the charge accumulation state to a signal for controlling the pixels to be set to the reset state.

6. The driving apparatus according to claim 1, wherein, in a case where a signal for performing a shutter operation is input, the state of the signal held in the memory unit is transitioned from a signal for controlling the pixels to be set to the reset state to a signal for controlling the pixels to be set to the charge accumulation state.

7. The driving apparatus according to claim 1, further comprising a scanning unit that selectively supplies the signal for readout to the plurality of row driving units.

8. A driving apparatus that outputs a drive signal for driving, per row, a plurality of pixels arranged to form a plurality of rows,
the driving apparatus comprising a plurality of row driving units arranged to correspond to the respective rows, wherein each of the row driving units includes:
a first memory unit that stores a first signal for instructing the pixels in a corresponding row to read out signals;
a second memory unit that stores a second signal for instructing the pixels in the corresponding row to perform a shutter operation; and
a third memory unit that stores a third signal for maintaining the pixels in the corresponding row in a charge accumulation state or a reset state, based on a signal obtained by a logical operation between the first signal output from the first memory unit and a fourth signal, and the second signal output from the second memory unit.

9. The driving apparatus according to claim 8, wherein, the third memory unit (1) in a case where the second signal is output from the second memory unit, stores the third signal for maintaining the reset state, and (2) in a case where the first signal is output from the first memory unit, stores either one of the third signal for maintaining the reset state or the third signal for maintaining the charge accumulation state, in accordance with a level of the fourth signal.

10. The driving apparatus according to claim 8,
wherein each of the row driving units includes a signal generation unit that generates a drive signal for driving the pixels, based on the first signal, the second signal, and the third signal, and
wherein in a case where neither the first signal nor the second signal is output, the signal generation unit generates a drive signal for controlling charge transfer in the pixels in accordance with the third signal.

11. The driving apparatus according to claim 8, further comprising a control circuit that supplies control signals to the row driving units,
wherein the fourth signal is a signal for allowing the third memory unit to be updated, the signal being input from the control circuit to each of the row driving units.

12. The driving apparatus according to claim 8, further comprising a control circuit that supplies control signals to the row driving units,
wherein the fourth signal is a signal for transferring charges in the pixels, the signal being input from the control circuit to each of the row driving units.

13. The driving apparatus according to claim 12,
wherein each of the plurality of pixels includes:
a charge accumulation unit that accumulates charges;
an output unit that includes an input node which receives the charges and that performs an output based on a potential of the input node;
a charge transfer unit that transfers the charges from the charge accumulation unit to the input node; and
a reset unit that resets the charge accumulation unit or the input node, and
wherein the charge transfer unit operates based on the signal for transferring charges.

14. The driving apparatus according to claim 11, wherein, in a case where the third memory unit is not allowed to be updated, the control circuit does not supply the signal for transferring charges in the pixels to the row driving units.

15. The driving apparatus according to claim 8, further comprising a scanning unit that selectively supplies the first signal and the second signal to the plurality of row driving units.

16. A photoelectric conversion apparatus comprising:
a pixel unit that includes a plurality of pixels; and
the driving apparatus according to claim 1.

17. A photoelectric conversion apparatus comprising at least one pixel including:
a charge accumulation unit that accumulates charges;
an output unit that includes an input node which receives the charges and that performs an output based on a potential of the input node;
a charge transfer unit that transfers the charges from the charge accumulation unit to the input node; and
a reset unit that resets the charge accumulation unit or the input node,
wherein a first operation starts in a case where the charge accumulation unit is in an accumulation state,
wherein a second operation is started after the first operation has been performed and while the accumulation state of the charge accumulation unit in the first operation is continued,
wherein in the first operation, the reset unit cancels a reset state of the input node, and the output unit performs a plurality of outputs while the accumulation state of the charge accumulation unit is maintained, and
wherein in the second operation, the reset unit cancels the reset state of the input node, and the output unit performs a first output while the accumulation state of the charge accumulation unit is maintained, the charge transfer unit subsequently transfers the charges from the charge accumulation unit to the input node, and the output unit subsequently performs a second output.

18. The photoelectric conversion apparatus according to claim 17, wherein the photoelectric conversion apparatus is configured to further perform a third operation in which, in a case where the charge accumulation unit is in a reset state, the reset unit cancels the reset state of the input node and the output unit performs the plurality of outputs.

19. The photoelectric conversion apparatus according to claim 17, wherein at least one pixel in which the first operation and the second operation are performed is entirely shielded so as to prevent light from entering.

20. The photoelectric conversion apparatus according to claim 17,
wherein a readout operation is performed before the first operation,
wherein a period in which the charge accumulation unit is set to a reset state exists after the readout operation has been performed and before the charge accumulation unit is set to the accumulation state, and
wherein in the readout operation, the reset unit cancels the reset state of the input node, the output unit performs a first output, the charge transfer unit subsequently transfers the charges from the charge accumulation unit to the input node, and the output unit subsequently performs the second output.

21. An imaging system comprising:
the photoelectric conversion apparatus according to claim 16; and
a signal processing unit that processes a signal output from the photoelectric conversion apparatus.

22. A mobile body comprising:
the photoelectric conversion apparatus according to claim 16;
a moving apparatus;
a processing apparatus that acquires information from a signal output from the photoelectric conversion apparatus; and
a control apparatus that controls the moving apparatus based on the information.

* * * * *